(12) United States Patent
Kijima et al.

(10) Patent No.: US 7,713,348 B2
(45) Date of Patent: May 11, 2010

(54) PRECURSOR COMPOSITION, METHOD OF MANUFACTURING PRECURSOR COMPOSITION, INKJET COATING INK, METHOD OF MANUFACTURING FERROELECTRIC FILM, PIEZOELECTRIC DEVICE, SEMICONDUCTOR DEVICE, PIEZOELECTRIC ACTUATOR, INKJET RECORDING HEAD, AND INKJET PRINTER

(75) Inventors: Takeshi Kijima, Matsumoto (JP); Setsuya Iwashita, Nirasaki (JP); Yasuaki Hamada, Suwa (JP)

(73) Assignee: Seiko Epson Corporation (JP)

( * ) Notice: Subject to any disclaimer, the term of this patent is extended or adjusted under 35 U.S.C. 154(b) by 1176 days.

(21) Appl. No.: 11/312,971

(22) Filed: Dec. 20, 2005

(65) Prior Publication Data

US 2006/0138382 A1  Jun. 29, 2006

(30) Foreign Application Priority Data

Dec. 24, 2004  (JP)  ............... 2004-373797

(51) Int. Cl.
*C09D 11/00* (2006.01)
(52) U.S. Cl. ............... 106/287.19; 106/31.13
(58) Field of Classification Search ............ 106/287.19, 106/31.13
See application file for complete search history.

(56) References Cited

U.S. PATENT DOCUMENTS 5,894,064 A    4/1999  Hampden-Smith et al.
5,908,802 A *  6/1999  Voigt et al. ............ 501/134
2004/0214352 A1* 10/2004  Kijima et al. ............ 438/3
2005/0271823 A1  12/2005  Kijima et al.

FOREIGN PATENT DOCUMENTS

| JP | 2003-002647 | 1/2003 |
| JP | 2006-151785 | 6/2006 |
| KR | A-2006-46288 | 5/2006 |
| WO | WO2004/038733 A | 5/2004 |

OTHER PUBLICATIONS

Hiromu Miyazawa, et al., Electronic States of Perovskite-type Oxides and Ferroelectricity, Jpn. J., Appl. Phys. 39 (2000) 5679.
Jungho Ryu, et al., "Effect of Heating Rate on the Sintering Behavior and the Piezoelectric Properties of Lead Zirconate Titanate Ceramics", Journal, American Ceramics Society, vol. 84, No. 4, pp. 902-904 (2001).
L. Bellaiche, et al. "Intrinsic Piezoelectric Response in Perovskite Alloys: PMN-PT versus PZT" Physical Review Letters, vol. 83, No. 7, Aug. 1999, pp. 1347-1350.
Communication from Korean Patent Office regarding corresponding application.

* cited by examiner

*Primary Examiner*—David M Brunsman
(74) *Attorney, Agent, or Firm*—Harness, Dickey & Pierce, P.L.C.

(57) ABSTRACT

A precursor composition including a precursor for forming a ferroelectric, the ferroelectric being shown by a general formula $AB_{1-x}C_xO_3$, an element A including at least Pb, an element B including at least one of Zr, Ti, V, W, and Hf, an element C including at least one of Nb and Ta, the precursor including at least the element B and the element C and part of the precursor including an ester bond, the precursor being dissolved or dispersed in an organic solvent, and the organic solvent including at least a first alcohol and a second alcohol having a boiling point and viscosity higher than a boiling point and viscosity of the first alcohol.

6 Claims, 18 Drawing Sheets

LEAD OCTYLATE

NIOBIUM OCTYLATE

NIOBIUM LEAD OCTYLATE

DIMETHYL SUCCINATE

DIETHYL SUCCINATE

[LINEAR SATURATED POLYCARBOXYLIC ACID]

DIBUTYL OXALATE

DIMETHYL MALONATE

DIMETHYL ADIPATE

TRIBUTYL CITRATE

TRIETHYL 1,1,2-ETHANETRICARBOXYLATE

TETRAETHYL 1,1,2,2-ETHANETETRACARBOXYLATE

[LINEAR UNSATURATED POLYCARBOXYLIC ACID]

DIMETHYL MALEATE

DIETHYL FUMARATE

TRANS-ACONITIC ACID

[CYCLIC POLYCARBOXYLIC ACID]

TRIMESIC ACID

PYROMELLITIC ACID

TRIMETHYL 1,2,4-BENZENETRICARBOXYLATE 1,2,3,4-CYCLOPENTANETETRACARBOXYLIC ACID

FIRST SCAN | LINE FEED | SECOND SCAN

PRECURSOR COMPOSITION, METHOD OF MANUFACTURING PRECURSOR COMPOSITION, INKJET COATING INK, METHOD OF MANUFACTURING FERROELECTRIC FILM, PIEZOELECTRIC DEVICE, SEMICONDUCTOR DEVICE, PIEZOELECTRIC ACTUATOR, INKJET RECORDING HEAD, AND INKJET PRINTER

Japanese Patent Application No. 2004-373797, filed on Dec. 24, 2004, is hereby incorporated by reference in its entirety.

BACKGROUND OF THE INVENTION

The present invention relates to a precursor composition for forming a ferroelectric film, a method of manufacturing a precursor composition, an inkjet coating ink, a method of manufacturing a ferroelectric film, a piezoelectric device, a semiconductor device, a piezoelectric actuator, an inkjet recording head, and an inkjet printer.

A ferroelectric such as PZT (Pb(Zr,Ti)$O_3$) has been used for various applications such as a ferroelectric memory, a piezoelectric device, an infrared sensor, and a surface acoustic wave (SAW) device, and has been extensively researched and developed.

As a typical ferroelectric formation method, a chemical solution deposition (CSD) method such as a sol-gel method or a metalorganic deposition (MOD) method has been known.

The sol-gel method uses a solution of a precursor prepared by polymerizing a compound such as a metal alkoxide by hydrolysis and polycondensation (hereinafter may be called "hydrolysis-condensation"). The sol-gel method has an advantage in that a ferroelectric is obtained with excellent composition controllability by controlling the composition of a metal alkoxide solution. However, since the hydrolysis-condensation reaction is an irreversible reaction, the metal alkoxide which has been crosslinked and polymerized cannot be used as the sol-gel raw material. In particular, when forming a lead-containing ferroelectric such as PZT, it is necessary to process lead waste.

The MOD method uses a solution of a stable organometallic compound such as a metal carboxylate. In the MOD method, since a stable organometallic compound is used as the raw material for the raw material solution, adjustment of the solution composition and handling are facilitated. However, since the MOD method forms a complex oxide by decomposing an organic group having a high molecular weight in an oxygen atmosphere, differing from the sol-gel method which forms a complex oxide by hydrolysis and polycondensation of a compound, the crystallization temperature is increased in comparison with the sol-gel method, so that the crystal grain size tends to be increased.

SUMMARY

According to a first aspect of the invention, there is provided a precursor composition including a precursor for forming a ferroelectric, the ferroelectric being shown by a general formula $AB_{1-x}C_xO_3$, an element A including at least Pb, an element B including at least one of Zr, Ti, V, W, and Hf, an element C including at least one of Nb and Ta, the precursor including at least the element B and the element C and part of the precursor including an ester bond, the precursor being dissolved or dispersed in an organic solvent, and the organic solvent including at least a first alcohol and a second alcohol having a boiling point and viscosity higher than a boiling point and viscosity of the first alcohol.

According to a second aspect of the invention, there is provided a method of manufacturing a precursor composition including a precursor for forming a ferroelectric, the ferroelectric being shown by a general formula $AB_{1-x}C_xO_3$, an element A including at least Pb, an element B including at least one of Zr, Ti, V, W, and Hf, and an element C including at least one of Nb and Ta, and the method comprising:

mixing a sol-gel raw material including at least the element B and the element C and including a hydrolysis-condensation product of a metal alkoxide, a polycarboxylic acid or a polycarboxylic acid ester, and an organic solvent including at least a first alcohol and a second alcohol having a boiling point and viscosity higher than a boiling point and viscosity of the first alcohol; and forming a precursor including an ester bond by esterification of the polycarboxylic acid or a polycarboxylic acid derived from the polycarboxylic acid ester and the metal alkoxide.

According to a third aspect of the invention, there is provided an inkjet coating ink comprising the above-described precursor composition.

According to a fourth aspect of the invention, there is provided a method of manufacturing a ferroelectric film, the method comprising:

applying the above-described inkjet coating ink a conductive film by discharging the inkjet coating ink from a head; and heat-treating the applied inkjet coating ink.

According to a fifth aspect of the invention, there is provided a piezoelectric device comprising a ferroelectric film manufactured by the above-described method of manufacturing a ferroelectric film.

According to a sixth aspect of the invention, there is provided a semiconductor device comprising a ferroelectric film manufactured by the above-described method of manufacturing a ferroelectric film.

According to a seventh aspect of the invention, there is provided a piezoelectric actuator comprising the above-described piezoelectric device.

According to an eighth aspect of the invention, there is provided an inkjet recording head comprising the above-described piezoelectric actuator.

According to a ninth aspect of the invention, there is provided an inkjet printer comprising the above-described inkjet recording head.

DETAILED DESCRIPTION OF THE EMBODIMENT

Figure 1:
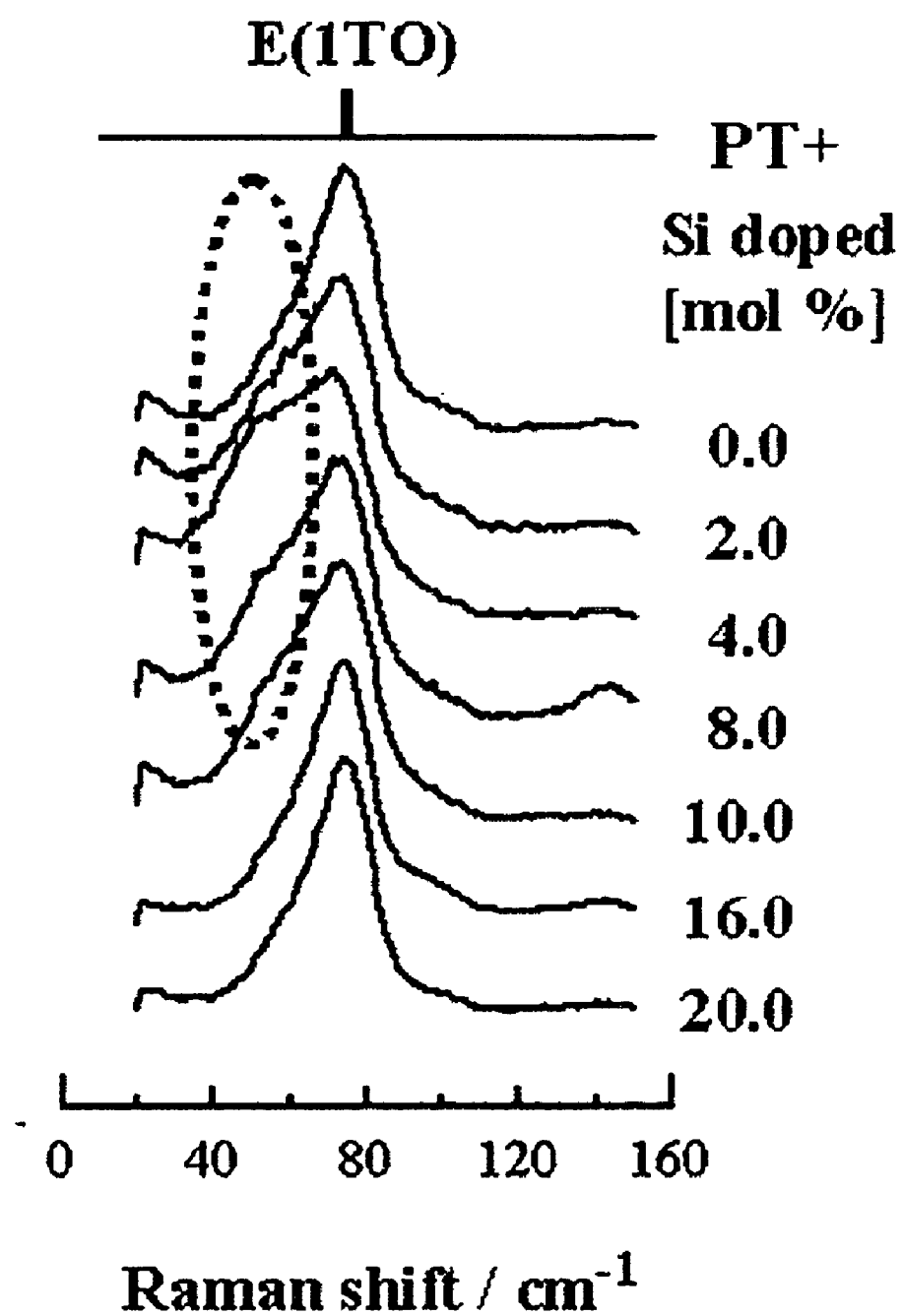
FIG. 1 shows a change in Raman vibration mode of an A-site ion when adding Si to lead titanate in one embodiment of the invention.

The invention may provide a precursor composition for forming a ferroelectric, which exhibits excellent composition controllability in a liquid-phase method, allows recycling of a metal component such as lead, and can be applied by using an inkjet coating method, and a method of manufacturing the precursor composition.

The invention may also provide an inkjet coating ink, a method of manufacturing a ferroelectric film, a piezoelectric device, a semiconductor device, a piezoelectric actuator, an inkjet recording head, and an inkjet printer all using the precursor composition of the invention.

According to one embodiment of the invention, there is provided a precursor composition including a precursor for forming a ferroelectric, the ferroelectric being shown by a general formula $AB_{1-x}C_xO_3$, an element A including at least Pb, an element B including at least one of Zr, Ti, V, W, and Hf, an element C including at least one of Nb and Ta, the precursor including at least the element B and the element C and part of the precursor including an ester bond, the precursor being dissolved or dispersed in an organic solvent, and the organic solvent including at least a first alcohol and a second alcohol having a boiling point and viscosity higher than a boiling point and viscosity of the first alcohol.

Since the precursor includes an ester bond to allow a reversible reaction, the polymerized precursor can be decomposed. Therefore, the decomposed product can be recycled as the precursor raw material.

Moreover, since the precursor composition includes the organic solvent including the first and second alcohols, the precursor composition may be applied to an inkjet coating method.

In this precursor composition, the element B may include Zr and Ti, and the element C may include Nb.

In this precursor composition, the precursor may further include the element A.

In this precursor composition, the ferroelectric may include Nb preferably in a range of $0.05 \leq x < 1$, or more preferably in a range of $0.1 \leq x \leq 0.3$.

In this precursor composition, the ferroelectric may include preferably 0.5 mol % or more of Si or Si and Ge, or more preferably 0.5 to 5 mol % of Si or Si and Ge. The crystallization temperature can be reduced by adding a small amount of Si as a sintering agent.

According to one embodiment of the invention, there is provided a method of manufacturing a precursor composition including a precursor for forming a ferroelectric, the ferroelectric being shown by a general formula $AB_{1-x}C_xO_3$, an element A including at least Pb, an element B including at least one of Zr, Ti, V, W, and Hf, and an element C including at least one of Nb and Ta, and the method comprising:

mixing a sol-gel raw material including at least the element B and the element C and including a hydrolysis-condensation product of a metal alkoxide, a polycarboxylic acid or a polycarboxylic acid ester, and an organic solvent including at least a first alcohol and a second alcohol having a boiling point and viscosity higher than a boiling point and viscosity of the first alcohol; and forming a precursor including an ester bond by esterification of the polycarboxylic acid or a polycarboxylic acid derived from the polycarboxylic acid ester and the metal alkoxide.

According to this manufacturing method, the precursor composition according to one embodiment of the invention can be easily obtained by esterification of the polycarboxylic acid or a polycarboxylic acid derived from the polycarboxylic acid ester and the metal alkoxide.

In the method of manufacturing a precursor composition according to one embodiment of the invention, the polycarboxylic acid or the polycarboxylic acid ester may be a carboxylic acid or a carboxylic acid ester having two or more carboxyl groups. As examples of the polycarboxylic acid used in one embodiment of the invention, the following compounds can be given. As examples of a tricarboxylic acid, trans-aconitic acid, trimesic acid, and the like can be given. As examples of a tetracarboxylic acid, pyromellitic acid, 1,2,3,4-cyclopentanetetracarboxylic acid, and the like can be given. As examples of the polycarboxylic acid ester which dissociates in an alcohol and functions as a polycarboxylic acid, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate and triethyl 1,1,2-ethanetricarboxylate, tetracarboxylic acid esters such as tetraethyl 1,1,2,2-ethanetetracarboxylate and trimethyl 1,2,4-benzenetricarboxylate, and the like can be given. These polycarboxylic acid esters dissociate in the presence of an alcohol and function as polycarboxylic acids. FIGS. 3A to 3D show examples of the above-mentioned polycarboxylic acids and polycarboxylic acid esters. A feature of one embodiment of the invention is that the network is grown by esterification by using the polycarboxylic acid. Since the ester network is not grown when using a monocarboxylic acid or a monocarboxylic acid ester, such as acetic acid or methyl acetate, a monocarboxylic acid or a monocarboxylic acid ester is not used in one embodiment of the invention.

In this method of manufacturing a precursor composition, the dicarboxylic acid ester may preferably be at least one ester selected from a succinic acid ester, a maleic acid ester, and a malonic acid ester. As specific examples of these esters, dimethyl succinate, dimethyl maleate, and dimethyl malonate can be given.

Figure 2:
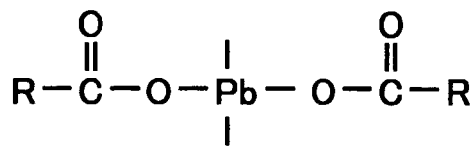
FIG. 2 shows lead-containing carboxylic acids used in one embodiment of the invention.
Figure 2:
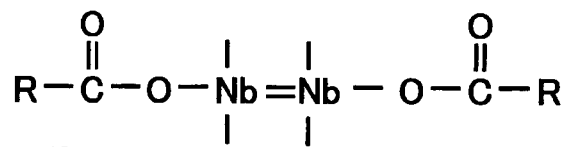
Figure 2:
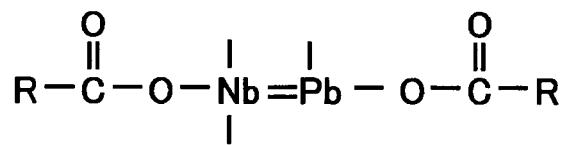
Figure 3A:
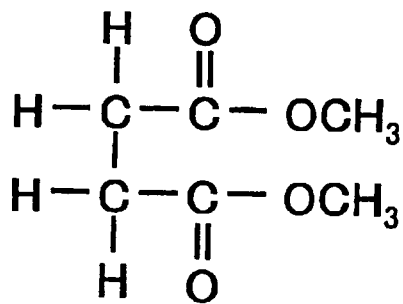
FIG. 3A shows polycarboxylic acids and polycarboxylic acid esters used in one embodiment of the invention.
Figure 3A:
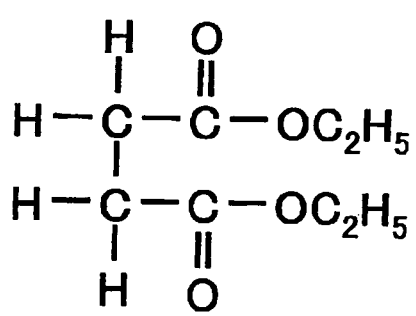
Figure 3B:
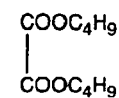
FIG. 3B shows polycarboxylic acids and polycarboxylic acid esters used in one embodiment of the invention.
Figure 3B:
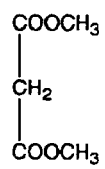
Figure 3B:
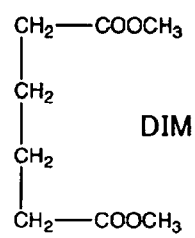
Figure 3B:
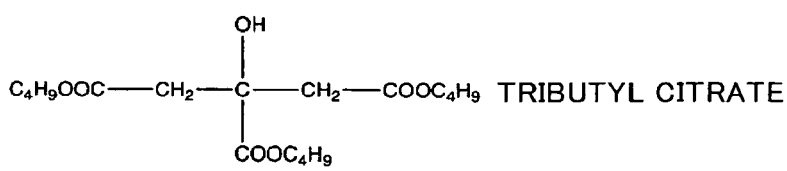
Figure 3B:
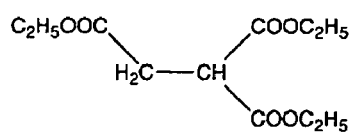
Figure 3B:
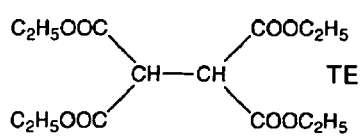
Figure 3C:
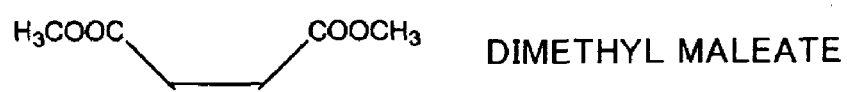
FIG. 3C shows polycarboxylic acids and polycarboxylic acid esters used in one embodiment of the invention.
Figure 3C:
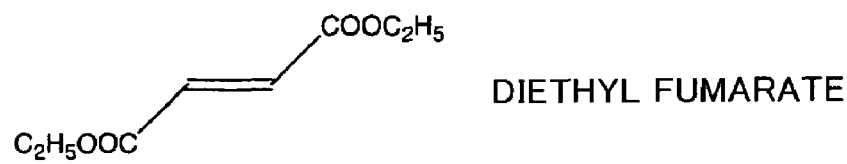
Figure 3C:
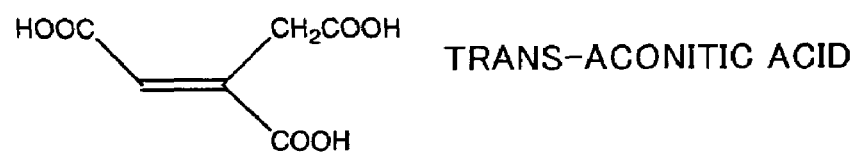
Figure 3D:
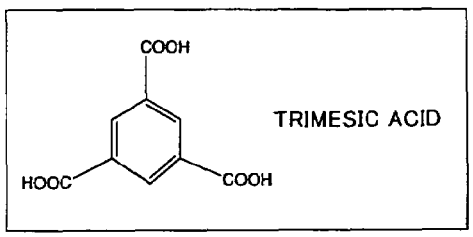
FIG. 3D shows polycarboxylic acids and polycarboxylic acid esters used in one embodiment of the invention.
Figure 3D:
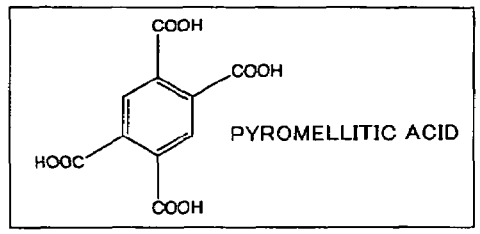
Figure 3D:
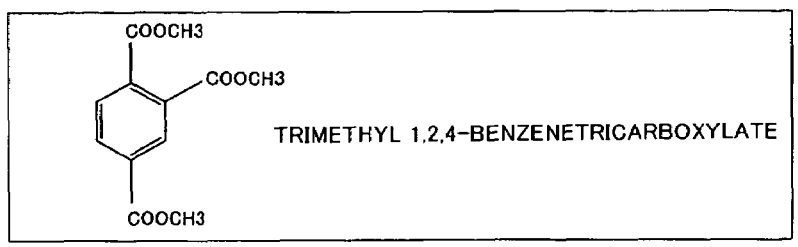
Figure 3D:
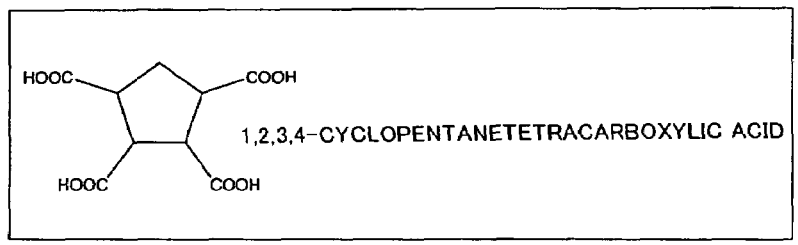

This method of manufacturing a precursor composition may further comprise mixing a sol-gel raw material including a metal carboxylate when mixing the sol-gel raw material, the polycarboxylic acid or the polycarboxylic acid ester, and the organic solvent. As examples of such a metal carboxylate, lead carboxylate such as lead acetate can be given. Further examples include lead octylate, niobium octylate, and niobium lead octylate as shown in FIG. 2.

This method of manufacturing a precursor composition may further comprise mixing an organometallic compound (MOD raw material) when mixing the sol-gel raw material, the polycarboxylic acid or the polycarboxylic acid ester, and the organic solvent. According to the method of manufacturing a precursor composition according to one embodiment of the invention, not only the alkoxide raw materials, but also the MOD raw material and the alkoxide raw material can be bonded through ester bonds.

In the method of manufacturing a precursor composition according to one embodiment of the invention, a sol-gel raw material including Si or Si and Ge may be used as the sol-gel raw material including a hydrolysis-condensation product of a metal alkoxide.

In this method of manufacturing a precursor composition, a solution prepared by mixing at least a $PbZrO_3$ sol-gel solution, a $PbTiO_3$ sol-gel solution, and a $PbNbO_3$ sol-gel solution may be used as the sol-gel solution. For example, the $PbNbO_3$ sol-gel solution is prepared by mixing lead octylate with niobium octylate. A state as shown in FIG. 2 is obtained by the alcohol exchange reaction between lead octylate and niobium octylate. A $PbTaO_3$ sol-gel solution may be used instead of the $PbNbO_3$ sol-gel solution.

In this method of manufacturing a precursor composition, the solution used as the sol-gel solution further may include a $PbSiO_3$ sol-gel solution.

According to one embodiment of the invention, there is provided a method of manufacturing a ferroelectric film, the method comprising: applying the inkjet coating ink including the above-described precursor composition to a conductive film by discharging the inkjet coating ink from a head; and heat-treating the applied inkjet coating ink. As the material for the conductive film, a platinum metal such as Pt or Ir may be used. A perovskite-type electrode material such as $SrRuO_3$ or $LaNiO_3$ may be used as the material for the conductive film.

According to one embodiment of the invention, there is provided a piezoelectric device comprising a ferroelectric film manufactured by the above-described method.

According to one embodiment of the invention, there is provided a semiconductor device comprising a ferroelectric film manufactured by the above-described method.

According to one embodiment of the invention, there is provided a piezoelectric actuator comprising the above-described piezoelectric device.

According to one embodiment of the invention, there is provided an inkjet recording head comprising the above-described piezoelectric actuator.

According to one embodiment of the invention, there is provided an inkjet printer comprising the above-described inkjet recording head.

These embodiments of the invention will be described in detail below, with reference to the drawings.

1. Precursor Composition

A precursor composition according to one embodiment of the invention is used to deposit a ferroelectric. The ferroelectric may be shown by the general formula $AB_{1-X}C_XO_3$. The element A may include at least Pb, the element B may include at least one of Zr, Ti, V, W, and Hf, and the element C may include at least one of Nb and Ta. According to one embodiment of the invention, the precursor includes at least the element B and the element C, and partially includes an ester bond. The precursor according to one embodiment of the invention is dissolved or dispersed in an organic solvent. The organic solvent includes at least a first alcohol and a second alcohol having a boiling point and viscosity higher than the boiling point and viscosity of the first alcohol.

According to one embodiment of the invention, an alcohol may be used as the organic solvent. The alcohol includes at least the first alcohol and the second alcohol having a boiling point and viscosity higher than the boiling point and viscosity of the first alcohol. The precursor composition may be suitably used for an inkjet coating method by combining the first alcohol and the second alcohol, as is clear from an example described later. The alcohol is not particularly limited insofar as the above-mentioned combination condition is satisfied. As examples of the alcohol, monohydric alcohols such as butanol, methanol, ethanol, and propanol, and polyhydric alcohols can be given. Specific examples of the alcohol are given below.

Monohydric Alcohol:

Propanol (propyl alcohol): 1-propanol (boiling point: 97.4° C.), 2-propanol (boiling point: 82.7° C., viscosity: 2.43 cp (/20° C.))

Butanol (butyl alcohol): 1-butanol (boiling point: 117° C., viscosity: 2.95 cp (/20° C.)), 2-butanol (boiling point: 100° C., viscosity: 4.21 cp (/20° C.)), 2-methyl-1-propanol (boiling point: 108° C., viscosity: 4.0 cp (/20° C.)), 2-methyl-2-propanol (melting point: 25.4° C., boiling point: 83° C., viscosity: 3.35 cp (/20° C.))

Pentanol (amyl alcohol): 1-pentanol (boiling point: 137° C., viscosity: 3.31 cp), 3-methyl-1-butanol (boiling point: 131° C., viscosity: 4.2 cp (/20° C.)), 2-methyl-1-butanol (boiling point: 128° C., viscosity: 5.09 cp (/20° C.)), 2,2-dimethyl-1-propanol (boiling point: 113° C.), 2-pentanol (boiling point: 119° C.), 3-methyl-2-butanol (boiling point: 112.5° C., viscosity: 4.2 cp (/20° C.)), 3-pentanol (boiling point: 117° C., viscosity: 4.12 cp (/20° C.)), 2-methyl-2-butanol (boiling point: 102° C., viscosity: 3.70 cp (/20° C.))

Nonyl alcohol: n-nonyl alcohol (boiling point: 213° C., viscosity: 14.3 cp (/20° C.))

Another monohydric alcohol: 2-(2-methoxyethoxy)ethanol (boiling point: 194° C., viscosity: 3.5 cp (/20° C.))

Polyhydric Alcohol:

Ethylene glycol (melting point: −11.5° C., boiling point: 197.5° C., viscosity: 25.66 cp (/20° C.)), glycerol (melting point: 17° C., boiling point: 290° C., viscosity: 1412 cp (/20° C.))

The organic solvent may include another alcohol. As another alcohol, an alcohol having intermediate properties (e.g. boiling point and/or viscosity) between the first alcohol and the second alcohol may be used.

A ferroelectric obtained by using the precursor composition according to one embodiment of the invention may include Nb in the range of preferably $0.05 \leq x < 1$, and still more preferably $0.1 \leq x \leq 0.3$. The ferroelectric may include Si or Si and Ge in an amount of preferably 0.5 mol % or more, and still more preferably 0.5 to 5 mol %. The element B may be Zr and Ti. Specifically, the ferroelectric according to one embodiment of the invention may be $Pb(Zr,Ti,Nb)O_3$ (PZTN) in which the Ti site is doped with Nb.

Nb has a size almost equal to the size of Ti (i.e. Nb and Ti have ionic radii close to each other and have an identical atomic radius) and has a weight twice the weight of Ti. Therefore, Nb is not easily released even if a collision occurs between atoms due to lattice vibration. Nb is stable at a valence of +5. Therefore, even if Pb is released, the valence of Pb can be compensated for by $Nb^{5+}$. Moreover, even if Pb is released during crystallization, it is easier for small Nb to enter the lattice than large O to be released.

Since $Nb^{4+}$ also exists, Nb can replace $Ti^{4+}$. Moreover, since Nb has very strong covalent bonding properties, Nb is not easily released (H. Miyazawa, E. Natori, S. Miyashita; Jpn. J. Appl. Phys. 39 (2000) 5679).

According to the ferroelectric (particularly PZTN) obtained by using the precursor composition according to one embodiment of the invention, since the ferroelectric includes a specific amount of Nb, the ferroelectric exhibits excellent composition controllability by eliminating an adverse effect caused by Pb deficiency. As a result, PZTN exhibits excellent hysteresis characteristics, leakage characteristics, reduction resistance, and insulating properties in comparison with PZT. The details are described in Japanese Patent Application No. 2004-380987 applied for by the applicant of the invention, for example.

Nb has been doped into PZT mainly in the Zr-rich rhombohedral region. However, the amount of doping is as small as about 0.2 to 0.025 mol % (J. Am. Ceram. Soc, 84 (2001) 902; Phys. Rev. Let, 83 (1999) 1347). This is because the crystallization temperature is increased by adding a large amount of Nb (e.g. 800° C. or more when adding Nb in an amount of 10 mol %).

Therefore, it is preferable to add $PbSiO_3$ (silicate) to the ferroelectric precursor composition in an amount of 0.5 to 5 mol %, for example. This reduces the crystallization energy of PZTN. Specifically, when using PZTN as a material for a ferroelectric film, the crystallization temperature of PZTN can be reduced by adding $PbSiO_3$ together with Nb. A silicate and a germanate may be used in combination instead of using only a silicate. The inventors of the invention confirmed that Si forms a part of the crystal as the A-site ion after functioning as a sintering agent. Specifically, as shown in FIG. 1, when adding Si to lead titanate, a change occurred in the Raman vibration mode E (1TO) of the A-site ion. The change occurred in the Raman vibration mode when the amount of Si added was 8 mol % or less. Therefore, it was confirmed that Si exists in the A-site of the perovskite when adding a small amount of Si.

According to one embodiment of the invention, Ta may be used instead of NB, or may be used together with Nb. Ta shows a tendency the same as that of Nb.

According to the precursor composition according to one embodiment of the invention, since the precursor includes an ester bond formed by esterification of the polycarboxylic acid and the metal alkoxide so that a reversible reaction can occur, the polymerized precursor can be decomposed into the metal alkoxide, as described later in detail. Therefore, the metal alkoxide can be recycled as the precursor raw material.

Moreover, one embodiment of the invention has the following advantages. A commercially available PZT sol-gel solution generally contains lead acetate as the lead raw material. However, since lead acetate bonds to an alkoxide of Ti or Zr to only a small extent, it is difficult for Pb to enter the precursor network. According to one embodiment of the invention, a first carboxyl group, which is one of two carboxyl groups of succinic acid (dicarboxylic acid) initially functioning as an acid, has a pH of 4.0, which is lower than that of acetic acid (pH=4.56) (i.e. stronger than acetic acid). Therefore, lead acetate bonds to succinic acid. Specifically, a reaction indicated by "salt of weak acid+strong acid? salt of strong acid+weak acid" occurs. Moreover, since the remaining second carboxyl group of succinic acid bonds to another MOD molecule or alkoxide, Pb can easily enter the precursor network.

According to one embodiment of the invention, the precursor composition may be applied to the inkjet coating method by using a specific alcohol, that is, an alcohol including at least the first alcohol having a relatively low boiling point and viscosity and the second alcohol having a boiling point and viscosity higher than the boiling point and viscosity of the first alcohol. As a result, a ferroelectric film having excellent characteristics can be obtained as evidenced by an example described later. Specifically, the precursor composition according to one embodiment of the invention may be used as an inkjet coating ink. The reason that the precursor composition according to one embodiment of the invention has excellent characteristics as the inkjet coating ink are described later.

When using the precursor composition according to one embodiment of the invention as the inkjet coating ink, it is preferable that the precursor composition have a viscosity of 10 cp or less, and still more preferably 5 cp or less.

2. Method of Manufacturing Precursor Composition

A method of manufacturing a precursor composition according to one embodiment of the invention may be used to form a ferroelectric shown by a general formula $AB_{1-x}C_xO_3$, in which the element A includes at least Pb, the element B includes at least one of Zr, Ti, V, W, and Hf, and the element C includes at least one of Nb and Ta. The manufacturing method according to one embodiment of the invention includes mixing a sol-gel raw material including at least the element B and the element C and including a hydrolysis-condensation product of a metal alkoxide, a polycarboxylic acid or a polycarboxylic acid ester, and an organic solvent including at least a first alcohol and a second alcohol having a boiling point and viscosity higher than the boiling point and viscosity of the first alcohol, and forming a precursor including an ester bond formed by esterification of the polycarboxylic acid or a polycarboxylic acid derived from the polycarboxylic acid ester and the metal alkoxide.

The manufacturing method according to one embodiment of the invention is useful as a method of manufacturing a ferroelectric in which the element B includes Zr and Ti and the element C includes Nb or Ta.

Figure 4:
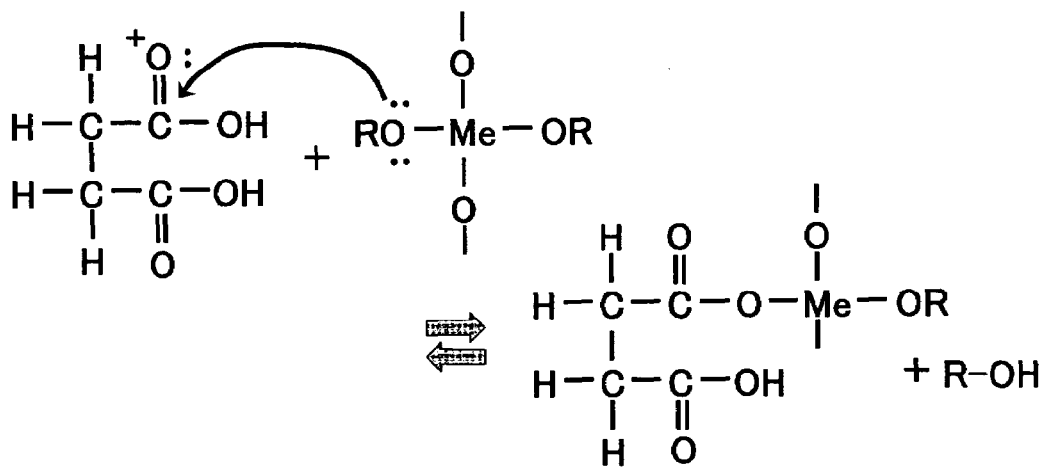
FIG. 4 shows a formation reaction of a precursor in a precursor composition according to one embodiment of the invention.
Figure 5:
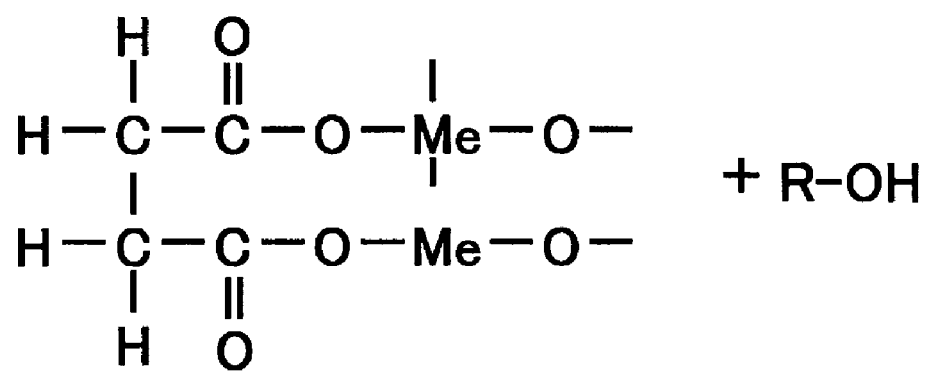
FIG. 5 shows a formation reaction of a precursor in a precursor composition according to one embodiment of the invention.

FIGS. 4 and 5 schematically show a precursor formation reaction in the manufacturing method according to one embodiment of the invention.

The precursor formation reaction is roughly divided into a first-stage alkoxy group substitution reaction as shown in FIG. 4, and a second-stage polymer network formation reaction by esterification as shown in FIG. 5. FIGS. 4 and 5 show an example of using dimethyl succinate as the polycarboxylic acid ester and n-butanol as the organic solvent. Although dimethyl succinate is nonpolar, dimethyl succinate dissociates in an alcohol to produce a dicarboxylic acid.

In the first-stage reaction, dimethyl succinate and the metal alkoxide of the sol-gel raw material undergo esterification and are bonded through an ester bond, as shown in FIG. 4. Specifically, dimethyl succinate dissociates in n-butanol so that one of the carbonyl groups (first carbonyl group) is protonated. A substitution reaction occurs between the first carbonyl group and the alkoxy group of the metal alkoxide to produce a reaction product, in which the first carboxyl group is esterified, and an alcohol. The "ester bond" used herein means a bond (—COO—) formed by a carbonyl group and an oxygen atom.

In the second-stage reaction, a substitution reaction occurs between the carboxyl group (second carboxyl group) remaining unreacted in the first-stage reaction and the alkoxy group of the metal alkoxide to produce a reaction product, in which the second carboxyl group is esterified, and an alcohol.

A polymer network in which the hydrolysis-condensation products of the metal alkoxide included in the sol-gel raw material are bonded through ester bonds is obtained by the above-described two-stage reaction. Therefore, the polymer network includes a moderate amount of ester bond in the network. Since dimethyl succinate dissociates in two stages and the first carboxyl group has an acid dissociation constant greater than the acid dissociation constant of the second carboxyl group, the first-stage reaction has a rate of reaction higher than the rate of reaction of the second-stage reaction. Therefore, the second-stage reaction proceeds more slowly than the first-stage reaction.

According to one embodiment of the invention, any of the following methods may be used to promote the above-described esterification reaction.

(1) The concentration or reactivity of the reaction product may be increased. In more detail, the reactivity is increased by increasing the degree of dissociation of the polycarboxylic acid or the polycarboxylic acid ester by increasing the temperature of the reaction system. It is preferable that the temperature of the reaction system be higher than room temperature and lower than the boiling point of the organic solvent, although the temperature of the reaction system is adjusted depending on the boiling point of the organic solvent. The temperature of the reaction system may be 100° C. or less, and preferably 50 to 100° C., for example.

(2) A reaction by-product may be removed. In more detail, esterification is promoted by removing water and an alcohol produced along with esterification.

(3) The molecular motion of the reaction product may be physically accelerated. In more detail, the reactivity of the reaction product is increased by applying energy rays such as ultraviolet rays.

The organic solvent used in the method of manufacturing a precursor composition according to one embodiment of the invention may be an alcohol including the specific first and second alcohols, as described above. As the alcohol, the above-mentioned alcohol may be used. The sol-gel raw material and the polycarboxylic acid or the polycarboxylic acid ester can be efficiently dissolved by using an alcohol as the solvent.

The polycarboxylic acid or the polycarboxylic acid ester used in the method of manufacturing a precursor composition according to one embodiment of the invention is not particularly limited. The above-mentioned polycarboxylic acid or polycarboxylic acid ester may be used. The polycarboxylic acid ester may have a molecular weight of 150 or less. If the molecular weight of the polycarboxylic acid ester is too high, the film may be damaged when the ester volatilizes during heat treatment, so that a dense film may not be obtained. The polycarboxylic acid ester may be liquid at room temperature. If the polycarboxylic acid ester is solid at room temperature, gelation may occur.

The amount of polycarboxylic acid or polycarboxylic acid ester used is adjusted depending on the compositional ratio of the sol-gel raw material and the ferroelectric. The ratio of the total molar ion concentration of the PZT sol-gel raw material, PbNb sol-gel raw material, and PbSi sol-gel raw material, to which the polycarboxylic acid bonds, to the molar ion concentration of the polycarboxylic acid is set at preferably "$1 \geq$ (molar ion concentration of polycarboxylic acid)/(total molar ion concentration of raw material solution)", and still more preferably 1:1. The polycarboxylic acid may be added in an amount of 0.35 mol, for example.

It is preferable that the amount of polycarboxylic acid or polycarboxylic acid ester added be equal to or greater than the total number of moles of the bond target raw material solution. All the raw materials bond when the molar ion concentration ratio is 1:1. However, since an ester stably exists in an acidic solution, it is preferable to add the polycarboxylic acid in excess to the total number of moles of the raw material solution in order to allow an ester to stably exist. The number of moles of the polycarboxylic acid or the polycarboxylic acid ester used herein refers to the number of carboxyl groups. Specifically, when using a dicarboxylic acid or a dicarboxylic acid ester, one molecule of the polycarboxylic acid or the polycarboxylic acid ester can bond to two raw material molecules. Therefore, the ratio is 1:1 when the amount of dicarboxylic acid or dicarboxylic acid ester is 0.5 mol for one mol of the raw material solution. The polycarboxylic acid ester does not initially function as an acid. The polycarboxylic acid ester produces a polycarboxylic acid when caused to dissociate in an alcohol. In this case, it is preferable that the number of moles of alcohol added be "$1 \geq$ (number of moles of alcohol/number of moles of polycarboxylic acid ester)". This is because the polycarboxylic acid ester sufficiently and stably dissociates as the number of moles of alcohol is greater. The number of moles of alcohol used herein refers to a molar ion concentration obtained by dividing the number of moles by the number of hydroxyl groups.

In the method of manufacturing a precursor composition according to one embodiment of the invention, a raw material including a metal carboxylate may be mixed. As examples of the metal carboxylate, the above-mentioned lead carboxylate such as lead acetate and lead octylate can be given.

In the method of manufacturing a precursor composition according to one embodiment of the invention, an organometallic compound (MOD raw material) may be used together with the sol-gel raw material. As the organometallic compound, niobium octylate may be used, for example. As shown in the FIG. 2, niobium octylate has a structure in which two Nb atoms form a covalent bond and an octyl group exists in the remaining site. In this case, since the network other than the two Nb atoms does not exist, niobium octylate is regarded as the MOD raw material.

A network is formed between the polycarboxylic acid and the MOD raw material mainly through an alcohol exchange reaction. When using niobium octylate, a reaction occurs between the carboxylic acid and the octyl group (alcohol exchange reaction), so that esterification (R—COO—Nb) proceeds. As described above, according to one embodiment of the invention, the molecules of the MOD raw material can be bonded to the precursor network through condensation between the MOD raw material and the alkoxide by esterifying the MOD raw material.

According to the method of manufacturing a precursor composition according to one embodiment of the invention, a sol-gel raw material including Si or Si and Ge may be used as the sol-gel raw material including the hydrolysis-condensation product of the metal alkoxide. As such a sol-gel solution, a $PbSiO_3$ sol-gel solution or a combination of a $PbSiO_3$ sol-gel solution and a $PbGeO_3$ sol-gel may be used. The deposition temperature can be reduced by using the sol-gel raw material including Si or Ge, whereby a ferroelectric can be crystallized at a temperature as low as about 450° C.

According to the method of manufacturing a precursor composition according to one embodiment of the invention, PZTN may be obtained by using a solution prepared by mixing at least a $PbZrO_3$ sol-gel solution, a $PbTiO_3$ sol-gel solution, and a $PbNbO_3$ sol-gel solution as the sol-gel solution. In this case, a sol-gel raw material including Si or Si and Ge may be mixed.

When introducing Ta instead of Nb, a $PbTaO_3$ sol-gel solution may be used as the sol-gel raw material.

The precursor of the precursor composition obtained according to one embodiment of the invention includes a moderate amount of ester bond between molecular networks so that a reversible reaction can occur. Therefore, the polymerized precursor (polymer network) may be decomposed into a metal alkoxide condensate by causing the reaction in the left direction shown in FIG. 4 to occur.

The manufacturing method and the precursor composition according to one embodiment of the invention have the following features.

According to the manufacturing method of one embodiment of the invention, a polymer network in which the hydrolysis-condensation products (molecular networks) of the metal alkoxide of the sol-gel raw material are bonded through ester bonds is obtained by the polycarboxylic acid in the organic solvent including a specific alcohol. Therefore, the polymer network includes a moderate amount of ester bond between the molecule networks derived from the hydrolysis-condensation products. The esterification reaction can be easily carried out by controlling the temperature or the like.

Since the precursor composition according to one embodiment of the invention includes a moderate amount of ester bond between the molecular networks, a reversible reaction can occur. Therefore, the polymerized precursor (polymer network) can be decomposed into the metal alkoxide (or the molecular network of the condensation product) in the composition remaining after deposition of a ferroelectric film. Since the metal alkoxide (or the molecular network of the condensation product) can be recycled as the precursor raw material, a toxic substance such as lead can be recycled. Therefore, it is advantageous from the viewpoint of environment.

According to one embodiment of the invention, the precursor composition can be applied by using the inkjet coating method by using a specific alcohol, that is, an alcohol including the first alcohol having a relatively low boiling point and viscosity and the second alcohol having a boiling point and viscosity higher than the boiling point and viscosity of the first alcohol as the solvent, so that a ferroelectric film having excellent characteristics can be deposited.

3. Method of Manufacturing Ferroelectric Film

A method of manufacturing a ferroelectric film according to one embodiment of the invention includes discharging and applying the precursor composition according to the above-described embodiment to a metal film including a platinum metal by using the inkjet coating method, and heating the resulting coating. Since the platinum metal has an excellent acidic catalyst effect on esterification, the ferroelectric film can be crystallized more favorably. The platinum metal may be at least one of Pt and Ir. A perovskite-type electrode material such as $SrRuO_3$ or $LaNiO_3$ may be used instead of the platinum metal. According to this manufacturing method, a ferroelectric film having excellent characteristics can be obtained by a simple method using the inkjet coating method.

Since the inkjet coating method allows selective deposition at a necessary location differing from a spin coating method, the amount of the precursor composition used can be significantly reduced. In particular, when forming a ferroelectric film including lead which causes a large amount of environmental impact such as PZTN, since the amount of lead used can be minimized, impact on the environment can be reduced. The inkjet coating method may be realized by using an known inkjet printer such as an inkjet printer described later.

As the heat treatment temperature of the film, a drying heat treatment may be performed at 150 to 180° C., a cleaning heat treatment may be performed at 150 to 180° C., and crystallization sintering may be performed at 550 to 700° C.

4. Example

An example of the invention is described below.

The example describes a method of preparing a PZTN raw material solution (inkjet coating ink) used for the inkjet coating method and a method of forming a PZTN film by the inkjet coating method using the PZTN solution.

A method of preparing a PZTN raw material solution sample is described below.

A solution prepared by dissolving a polycondensation product for forming a $PbZrO_3$ perovskite crystal in n-butanol as a solvent in an anhydrous state (hereinafter called "PZ solution") and a solution prepared by dissolving a polycondensation product for forming a $PbTiO_3$ perovskite crystal in n-butanol as a solvent in an anhydrous state (hereinafter called "PT solution") were mixed at a ratio of "PZ solution: PT solution =25:55" to prepare a solution 1.

Then, lead octylate and niobium octylate were mixed in n-butanol as a solvent at a ratio of 1:1 to prepare a solution 2 (hereinafter called "PN solution").

The solution 1 and the solution 2 were mixed so that "Zr: Ti:Nb=25:55:20" to prepare a raw material solution 1 for forming $PbZr_{0.25}Ti_{0.55}Nb_{0.2}O_3$. The solution 1 and the solution 2 respectively contain Si for decreasing the crystallization temperature in an amount of 1.5 mol %.

In order to bond the molecules or the molecule networks containing each metal element by esterification, 0.5 mol/L of dimethyl succinate was mixed with 1 mol/L of the raw material solution 1. After allowing the mixture to stand at 90° C.

for 30 min in a sealed state, the mixture was cooled to room temperature to sufficiently promote esterification to obtain a raw material solution 2.

Then, 2-(2-methoxyethoxy)ethanol and n-nonyl alcohol were added to the raw material solution 2 so that the ratio of 2-(2-methoxyethoxy)ethanol, n-nonyl alcohol, and n-butanol in the raw material solution 2 was 2:1:1 to obtain a sample solution of a raw material solution (inkjet coating ink) of the example, in which the concentration of $PbZr_{0.25}Ti_{0.55}Nb_{0.2}O_3$ was adjusted to 0.5 mol %. Table 1 shows the boiling point and the viscosity of each alcohol solvent. The viscosity of the mixed solvent was 5.1.

TABLE 1

| Solvent | Boiling point (° C.) | Viscosity (cp) |
| --- | --- | --- |
| n-Butanol | 118 | 2.5 |
| 2-(2-Methoxyethoxy)ethanol | 194 | 3.5 |
| n-Nonyl alcohol | 213 | 14.3 |

A $PbZr_{0.25}Ti_{0.55}Nb_{0.2}O_3$ film was formed by using the sample solution. In more detail, the sample solution was applied to an 8-inch silicon wafer coated with a Pt electrode using an inkjet printer (manufactured by Seiko Epson Corporation) by applying an electric field of 20 V and 5 kHz to an inkjet head to form a coating. The coating was held on a hot plate at 150° C. for 5 min and at 300° C. for 5 min (presintering) to obtain a $PbZr_{0.25}Ti_{0.55}Nb_{0.2}O_3$ amorphous film having a thickness of 20 nm. The sample solution was repeatedly applied by inkjet coating eight times at one location. The film was then crystallized at 650° C. for 5 min in an oxygen atmosphere. The thickness of the film after crystallization was 130 nm.

The $PbZr_{0.2}Ti_{0.55}Nb_{0.2}O_3$ film (PZTN film) sample obtained by the above-described method was evaluated as described below.

(1) X-ray Analysis

Figure 6:
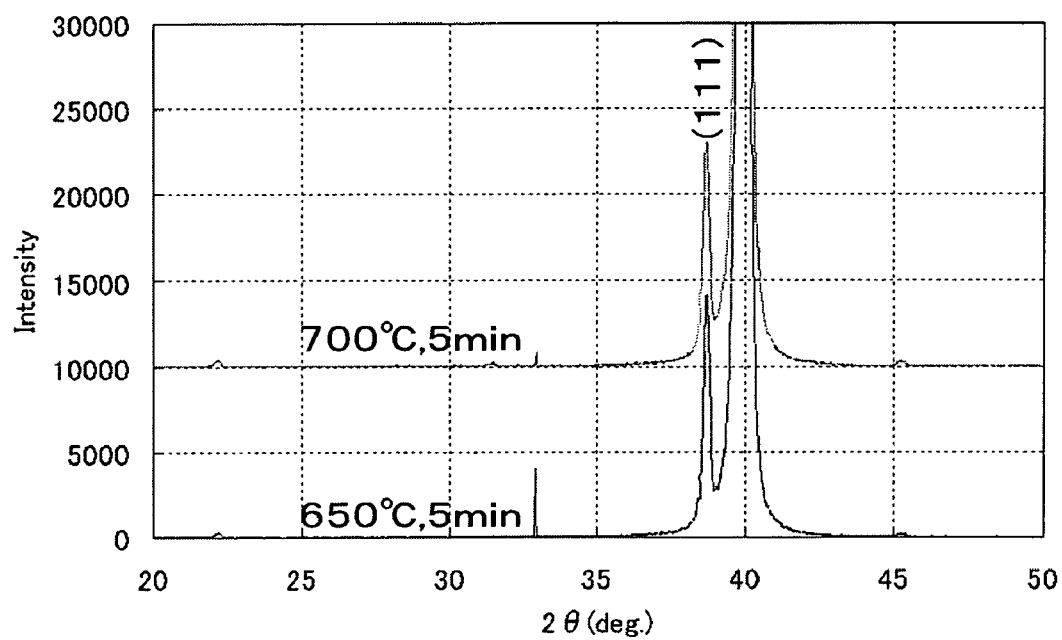
FIG. 6 shows X-ray analysis results of a ferroelectric according to an example.

FIG. 6 shows the XRD pattern of the PZTN film sample of the example. As shown in FIG. 6, it was confirmed that PZTN of the example is tetragonal and (111)-oriented. FIG. 6 also shows the results of the sample obtained by setting the sintering temperature at 700° C.

(2) Hysteresis Characteristics

Figure 7:
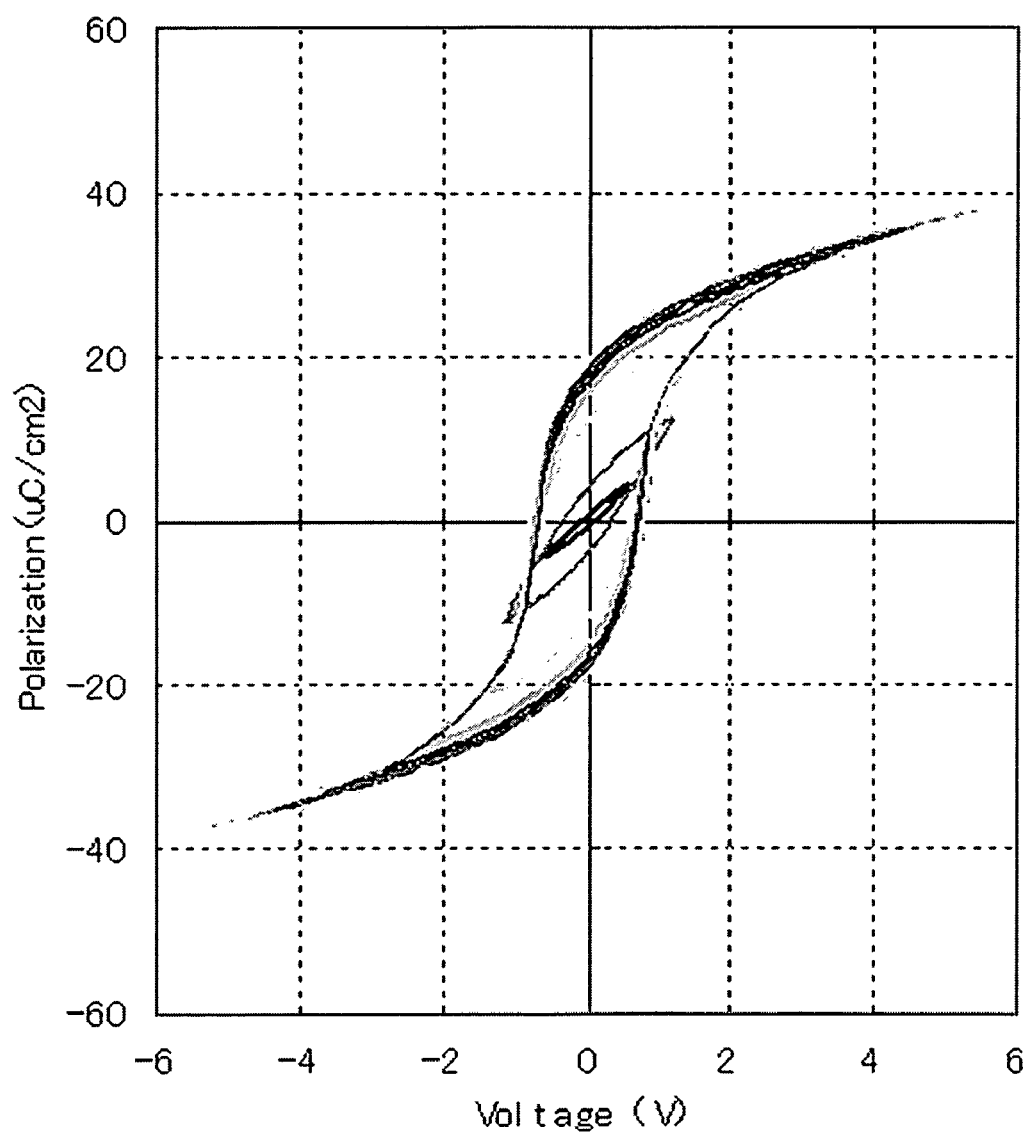
FIG. 7 shows hysteresis characteristics of a ferroelectric according to an example of the invention.

FIG. 7 is a hysteresis diagram of the PZTN film sample of the example. As shown in FIG. 7, it was confirmed that the PZTN film of the example has excellent hysteresis characteristics.

(3) Cross-sectional Structure and Planar Structure of PZTN Film

Figure 8:
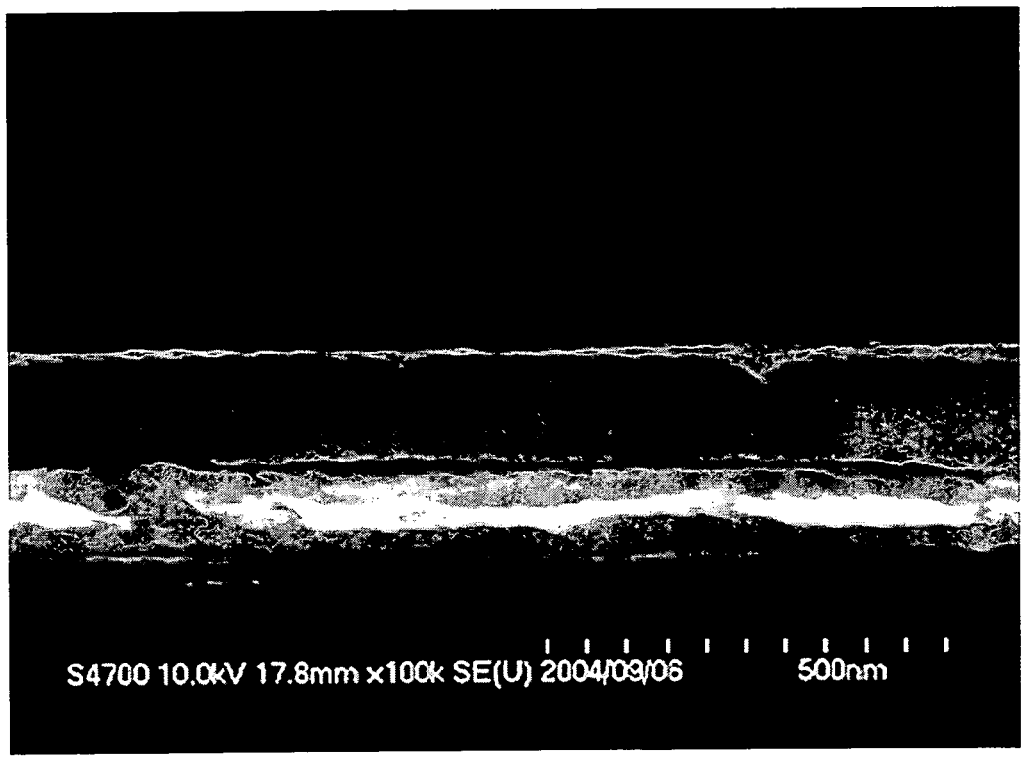
FIG. 8 is an SEM image showing cross-sectional morphology of a ferroelectric film according to an example of the invention.
Figure 9:
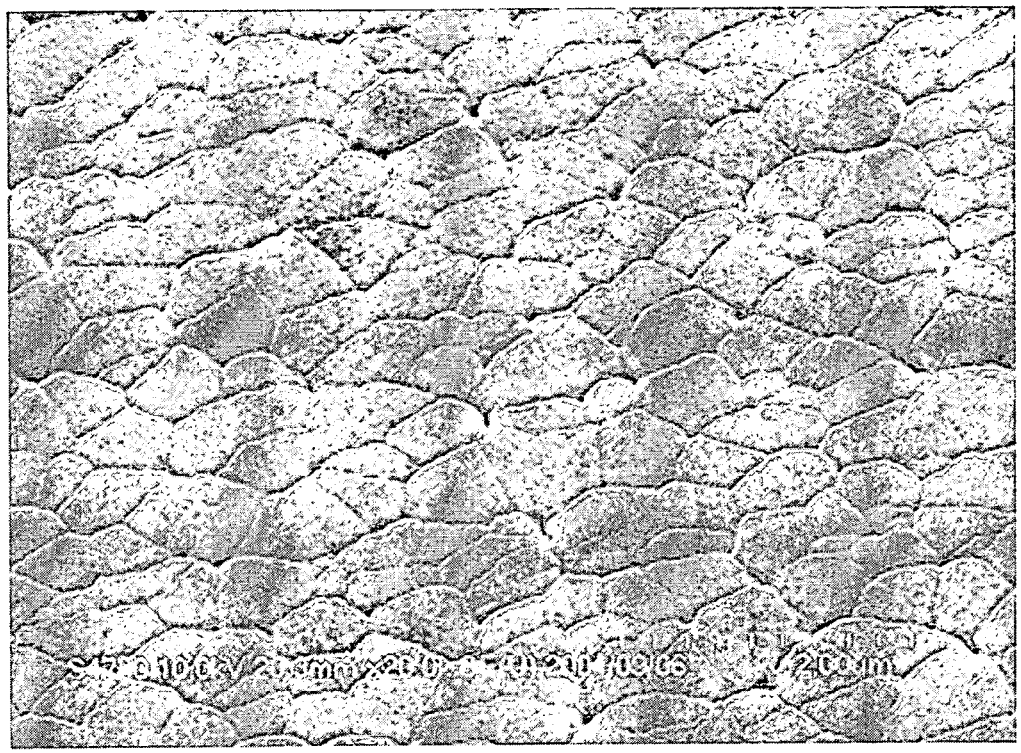
FIG. 9 is an SEM image showing surface morphology of a ferroelectric film according to an example of the invention.

FIG. 8 is an SEM image showing the cross-sectional morphology of the PZTN film, and FIG. 9 is an SEM image showing the surface morphology of the PZTN film. As shown in FIGS. 8 and 9, it was confirmed that the PZTN film of the example is a film equal to a film formed by spin coating, that is, has a uniform thickness and a dense, flat, and smooth surface.

(4) Discharge Properties of Sample Solution (Inkjet Coating Ink)

Figure 10:
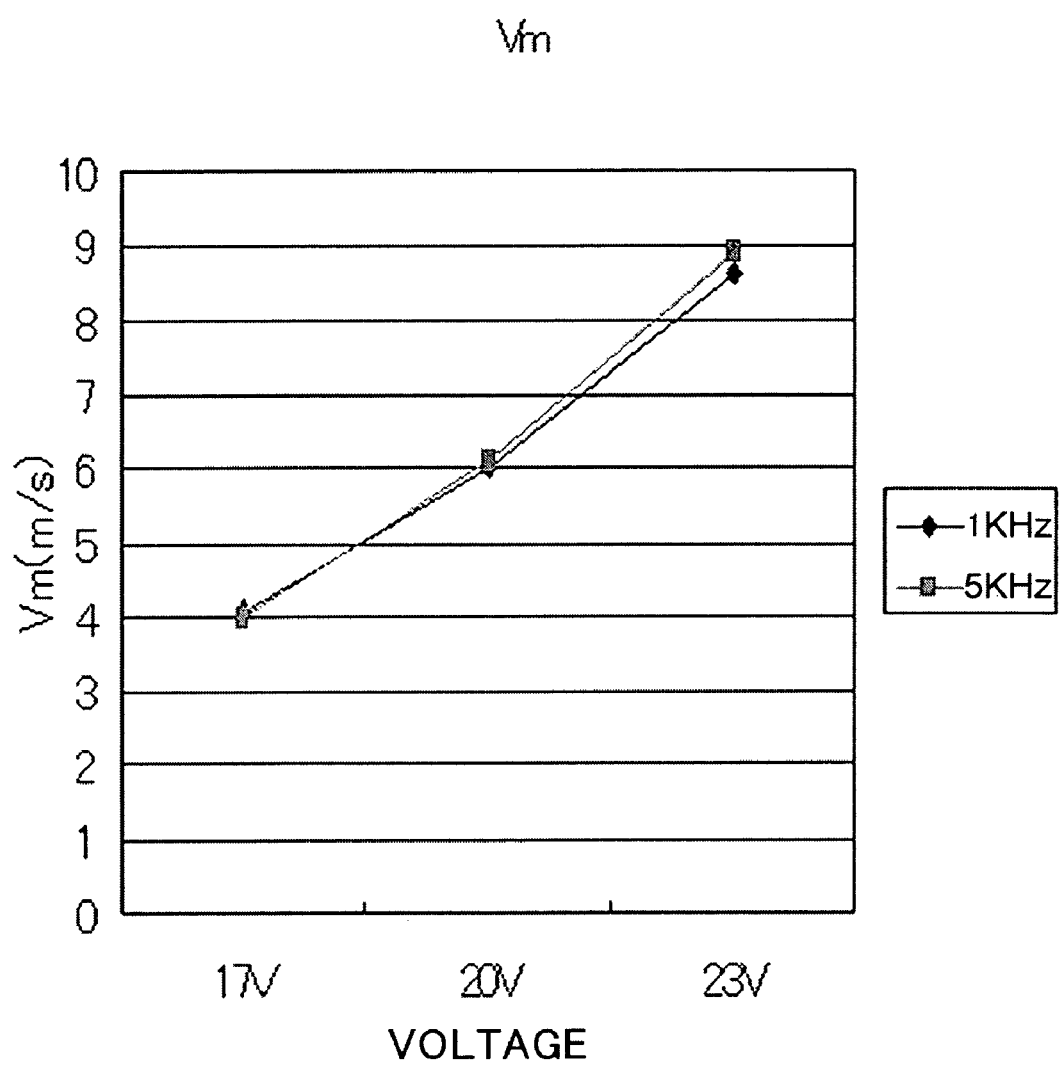
FIG. 10 shows discharge properties of an inkjet coating ink according to an example of the invention.
Figure 11:
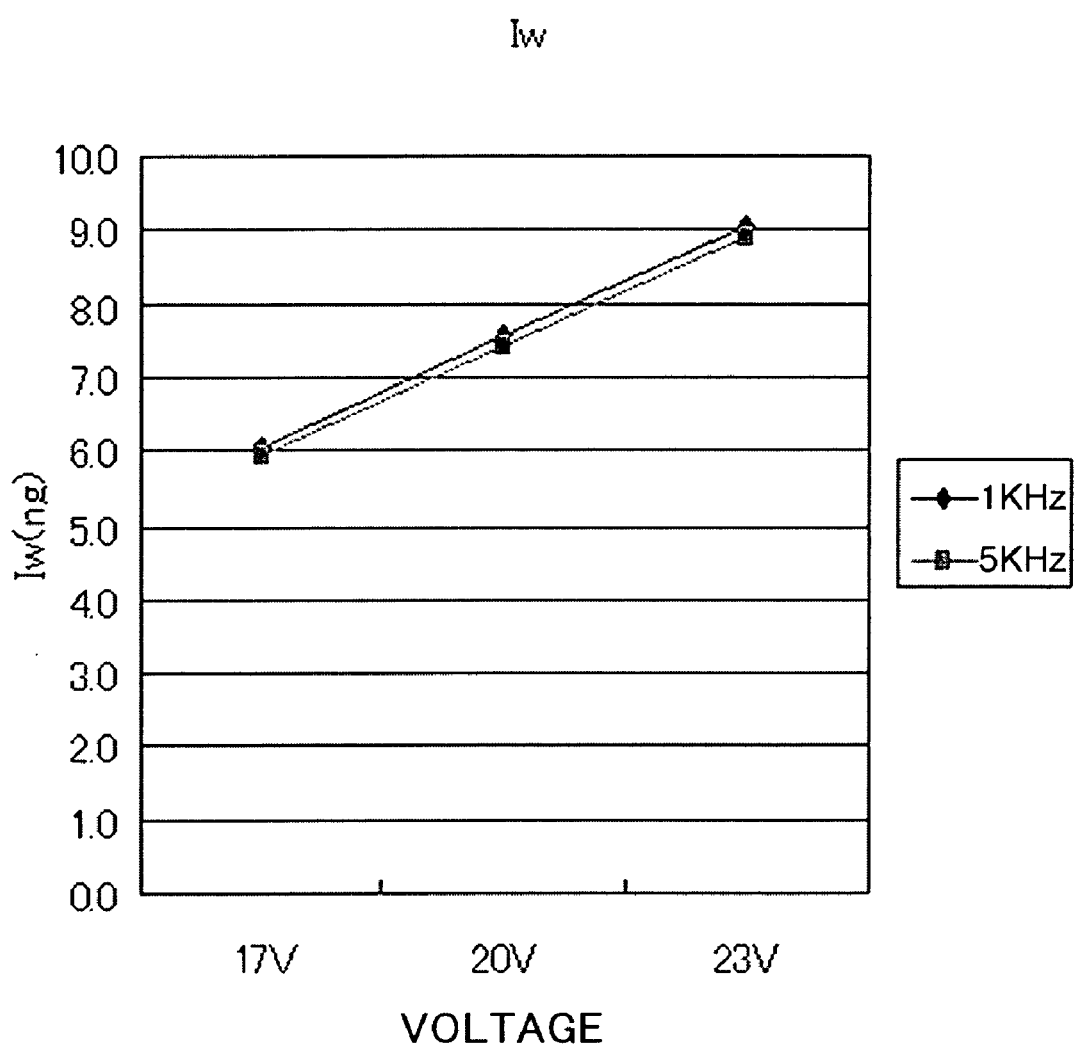
FIG. 11 shows discharge properties of an inkjet coating ink according to an example of the invention.

FIG. 10 shows the relationship between the voltage and the discharge speed, and FIG. 11 shows the relationship between the voltage and the amount of ink discharged.

As shown in FIGS. 10 and 11, it was confirmed that the ink discharge speed and the amount of ink discharged are directly proportional to the voltage applied to the piezoelectric device due to the absence of clogging or the like.

As shown in FIGS. 10 and 11, it was confirmed that the sample solution of the example can be suitably used for the inkjet coating method.

(5) Discharge Properties of Sample Solution

Figure 12:
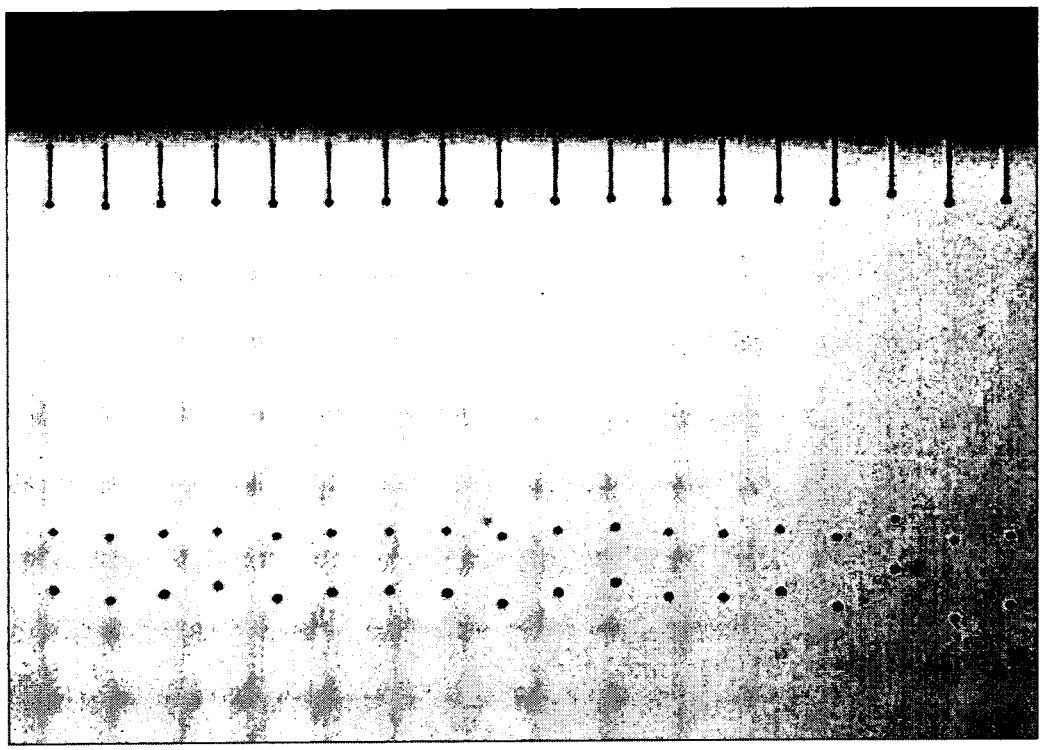
FIG. 12 shows discharge properties of an inkjet coating ink according to an example of the invention.

FIG. 12 is a diagram showing the sample solution discharged from the ink jet head. As shown in FIG. 12, it was confirmed that the sample solution of the example has excellent discharge properties.

(6) Line-feed Unevenness of Film Obtained by Using Sample Solution

Figure 13:
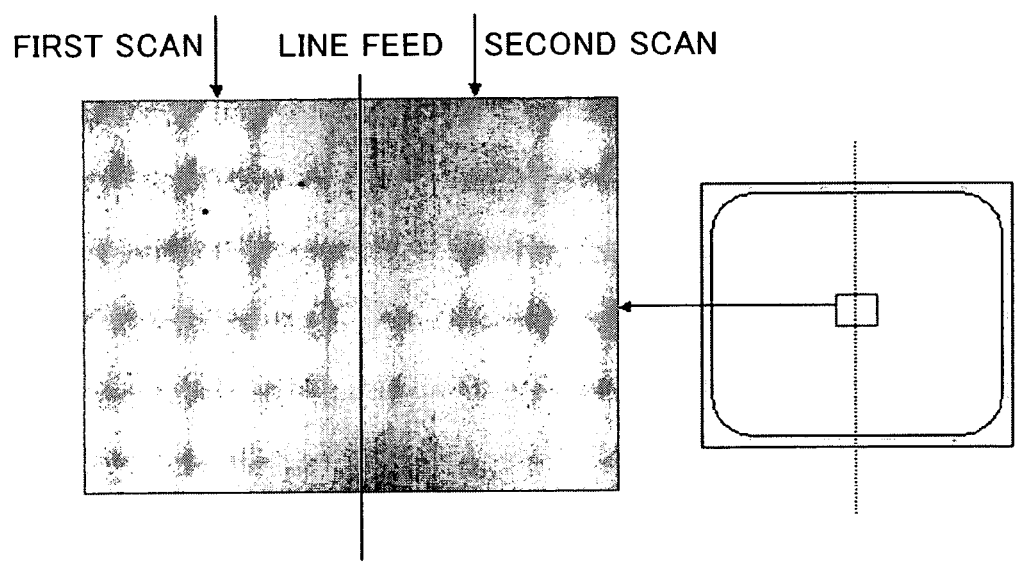
FIG. 13 shows discharge properties of an inkjet coating ink according to an example of the invention.

FIG. 13 shows line-feed unevenness of a film obtained by inkjet coating the sample solution of the example. The term "line-feed unevenness" used herein refers to a "coffee stain phenomenon" caused by protrusion of the edge of a film (dot) formed by using the inkjet coating method.

The line-feed unevenness was evaluated by naked eye observation and by using an SEM and a surface roughness meter.

FIG. 13 shows the SEM image. As shown in FIG. 13, line-feed unevenness occurred to only a small extent in the PZTN film formed by using the sample solution of the example, so that an excellent coating was obtained.

As described above, it was confirmed that the sample solution according to the example has excellent ferroelectric characteristics and excellent discharge properties and is suitably used for the inkjet coating method.

(7) Dot Shape

Figure 14A:
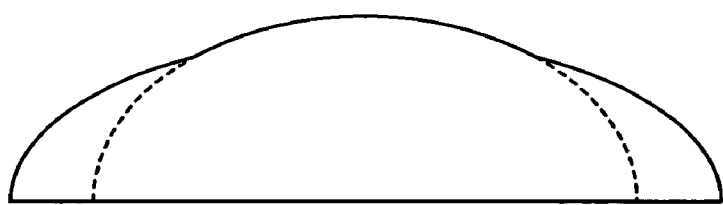
FIGS. 14A and 14B show the shape of a dot formed by using an inkjet coating method in an example of the invention and a comparative example.
Figure 14B:

FIGS. 14A and 14B show the shape of a dot formed by the inkjet coating method using the sample solutions of the example and a comparative example. FIG. 14A schematically shows the shape of one dot obtained by using the sample solution of Example 1 under the above inkjet coating conditions. FIG. 14B shows the shape of one dot of the comparative example obtained in the same manner as in Example 1 except for using only n-butanol as the alcohol solvent.

As shown in FIGS. 14A and 14B, it was confirmed that the dot of the example has a smooth external shape without a protruding edge and that a protruding edge is formed at the outer circumference in the comparative example so that a flat dot is not formed.

The reason that such a dot shape is formed is considered to be as follows.

In the example, since the organic solvent includes two types of alcohols which differ in boiling point and viscosity, these alcohols exhibit respective functions to prevent edge formation. Specifically, as shown in FIG. 14A, the first alcohol (n-butanol) having a low boiling point and viscosity instantaneously solidifies in the periphery of the droplet. However, since the second alcohol (n-nonyl alcohol) having a high boiling point and viscosity exists at the center, the solute dissolved in the second alcohol remains at the center and is not concentrated on the periphery. Therefore, a deposit is not locally grown at the periphery. Moreover, since the first alcohol at the periphery of the droplet is pulled toward the second alcohol located at the center and having high viscosity to have a large contact angle in comparison with the case of using only the first alcohol, the first alcohol relatively vaporizes to a small extent. This prevents formation of a protruding deposit at the periphery, whereby an entirely flat dot is formed.

On the other hand, in the comparative example in which only the first alcohol having a low boiling point and viscosity is used, the contact angle of the droplet is small and the surface area of the periphery is relatively increased in comparison with the center, so that the solvent easily vaporizes and solidifies. A capillary phenomenon occurs in the solidified area from the deposit as a nucleus, so that the deposit is grown at the edge in the direction perpendicular to the substrate. As a result, a coffee stain phenomenon occurs.

5. Semiconductor Device

A semiconductor device including a ferroelectric film formed by using the raw material solution according to one embodiment of the invention is described below. In one embodiment of the invention, a ferroelectric memory device including a ferroelectric capacitor which is an example of a semiconductor device is described as an example.

Figure 15A:
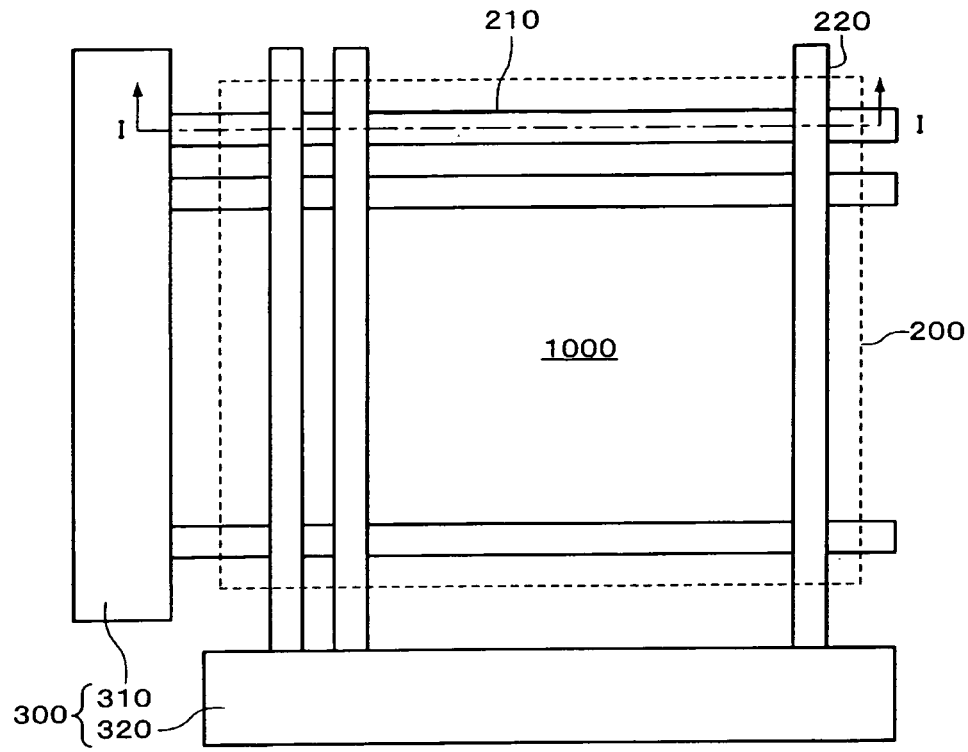
FIGS. 15A and 15B show a semiconductor device according to one embodiment of the invention.
Figure 15B:
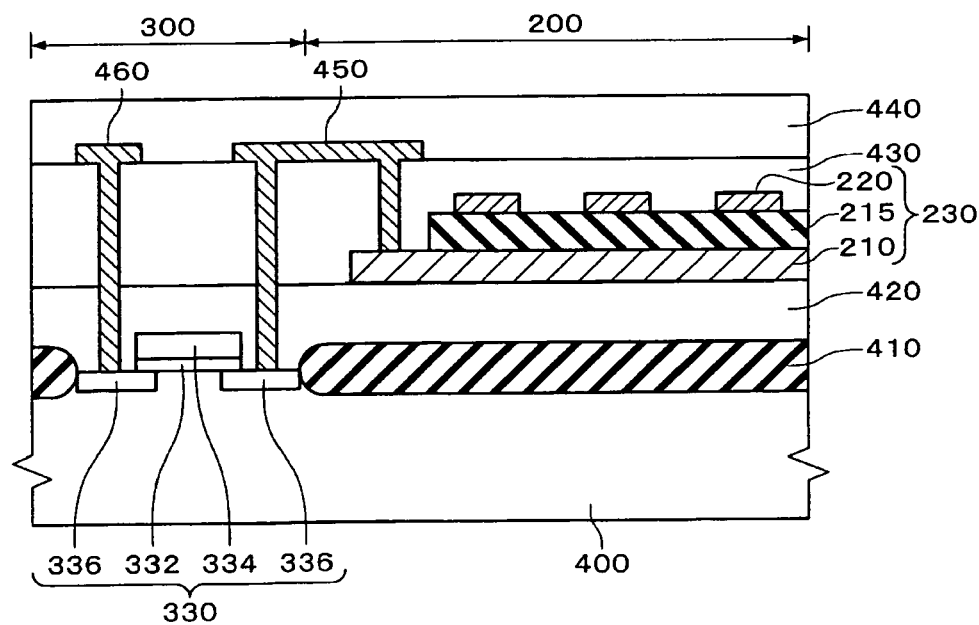

FIGS. 15A and 15B are diagrams schematically showing a ferroelectric memory device 1000 using a ferroelectric capacitor obtained by using the manufacturing method according to the above-described embodiment. FIG. 15A shows the planar shape of the ferroelectric memory device 1000, and FIG. 15B shows the cross section along the line I-I shown in FIG. 15A.

As shown in FIG. 15A, the ferroelectric memory device 1000 includes a memory cell array 200 and a peripheral circuit section 300. The memory cell array 200 and the peripheral circuit section 300 are formed in different layers. The peripheral circuit section 300 is disposed on a semiconductor substrate 400 in a region differing from the memory cell array 200. As specific examples of the peripheral circuit section 300, a Y gate, a sense amplifier, an input-output buffer, an X address decoder, a Y address decoder, or an address buffer can be given.

In the memory cell array 200, lower electrodes 210 (wordlines) for selecting a row and upper electrodes 220 (bitlines) for selecting a column are arranged to intersect. The lower electrodes 210 and the upper electrodes 220 are formed in the shape of stripes formed by linear signal electrodes. The signal electrodes may be formed so that the lower electrodes 210 function as the bitlines and the upper electrodes 220 function as the wordlines.

As shown in FIG. 15B, a ferroelectric layer 215 is disposed between the lower electrodes 210 and the upper electrodes 220. In the memory cell array 200, a memory cell which functions as a ferroelectric capacitor 230 is formed in the intersecting region of the lower electrode 210 and the upper electrode 220. The ferroelectric film 215 is a film formed by using the raw material solution according to the above-described embodiment. It suffices that the ferroelectric film 215 be disposed at least in the intersecting region of the lower electrode 210 and the upper electrode 220.

In the ferroelectric memory device 1000, a second interlayer dielectric 430 is formed to cover the lower electrode 210, the ferroelectric film 215, and the upper electrode 220. An insulating protective layer 440 is formed on the second interlayer dielectric 430 so as to cover interconnect layers 450 and 460.

As shown in FIG. 15A, the peripheral circuit section 300 is configured to include various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 15B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are isolated by an element isolation region 410. A first interlayer dielectric 420 is formed on the semiconductor substrate 400 on which the MOS transistor 330 is formed. The peripheral circuit section 300 is electrically connected with the memory cell array 200 through an interconnect layer 51.

An example of write and read operations of the ferroelectric memory device 1000 is described below.

In the read operation, a read voltage is applied to the capacitor of the selected memory cell. This also serves as a write operation of "0". At this time, current flowing through the selected bitline or a potential when causing the bitline to be in a high impedance state is read by using a sense amplifier. A specific voltage is applied to the capacitors of the unselected memory cells in order to prevent occurrence of crosstalk during reading.

In the write operation of "1", a write voltage which causes polarization reversal is applied to the capacitor of the selected memory cell. In the write operation of "0", a write voltage which does not cause polarization reversal is applied to the capacitor of the selected memory cell, so that the "0" state written during the read operation is maintained. A specific voltage is applied to the capacitors of the unselected memory cells in order to prevent occurrence of crosstalk during writing.

In the ferroelectric memory device 1000, the ferroelectric capacitor 230 includes the ferroelectric film 215 which can be crystallized at a low temperature. Therefore, the ferroelectric memory device 1000 can be manufactured without causing the MOS transistor 330 making up the peripheral circuit section 300 or the like to deteriorate. Since the ferroelectric capacitor 230 has excellent hysteresis characteristics, a highly reliable ferroelectric memory device 1000 can be provided.

Figure 16:
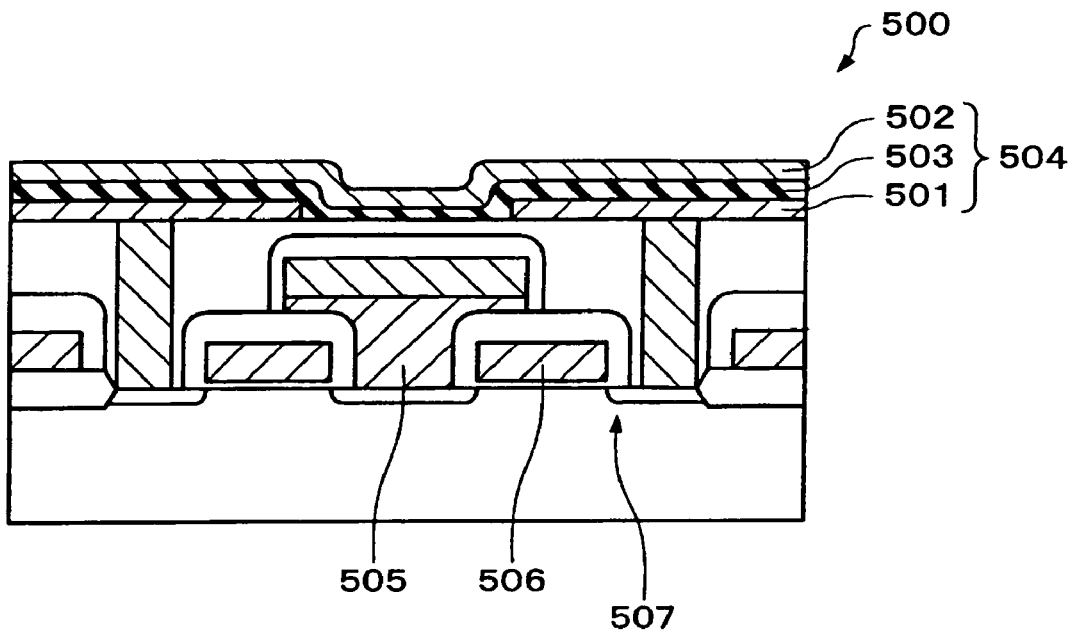
FIG. 16 is a cross-sectional diagram schematically showing a 1T1C type ferroelectric memory according to one embodiment of the invention.
Figure 17:
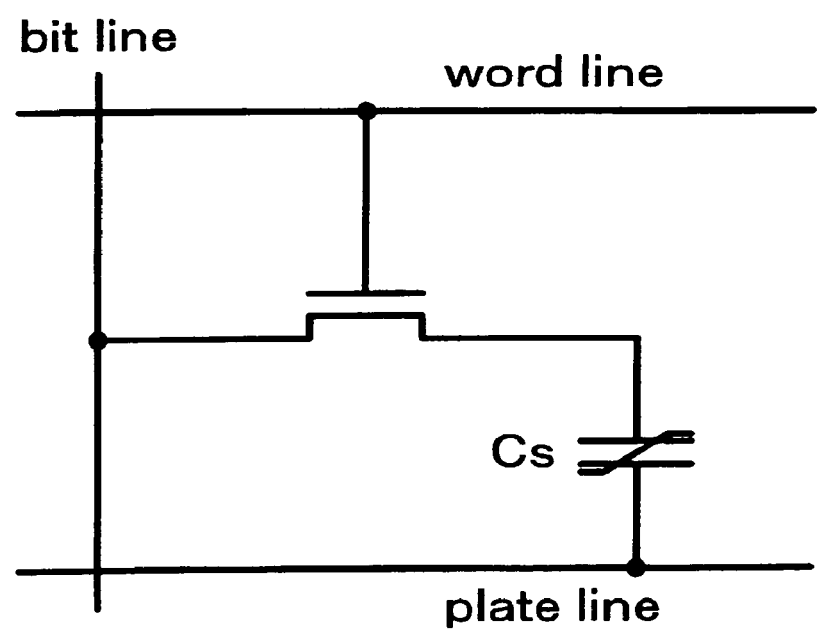
FIG. 17 shows an equivalent circuit of the ferroelectric memory shown in FIG. 16.

FIG. 16 is a structural diagram of a 1T1C type ferroelectric memory device 500 as another example of the semiconductor device. FIG. 17 is an equivalent circuit diagram of the ferroelectric memory device 500.

As shown in FIG. 16, the ferroelectric memory device 500 is a memory device having a structure similar to that of a DRAM, and includes a capacitor 504 (1C) including a lower electrode 501, an upper electrode 502 connected with a plate line, and a ferroelectric film 503 according to the above-described embodiment, and a switch transistor element 507 (1T) including source/drain electrodes, one of which is connected with a data line 505, and a gate electrode 506 connected with a wordline. Since the 1T1C type memory allows high-speed writing and reading (100 ns or less) and written data does not volatilize, the 1T1C type memory is expected to replace an SRAM.

According to the semiconductor device according to one embodiment of the invention, since the ferroelectric film is formed by using the raw material solution according to the above-described embodiment, the semiconductor film can be crystallized at a low temperature. Therefore, the ferroelectric capacitor can be embedded with a semiconductor device such as a MOS transistor. The semiconductor device according to one embodiment of the invention is not limited to the above-described examples, and may be applied to a 2T2C type ferroelectric memory device or the like.

6. Piezoelectric Device

An example of applying a ferroelectric film formed by using the raw material solution according to the above-described embodiment to a piezoelectric device is described below.

Figure 18:
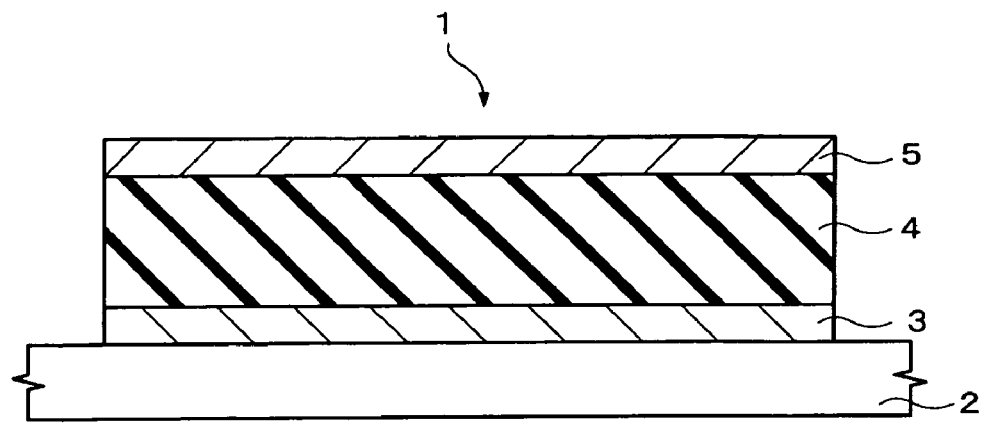
FIG. 18 is a cross-sectional diagram schematically showing a piezoelectric device according to one embodiment of the invention.

FIG. 18 is a cross-sectional diagram showing a piezoelectric device 1 including a ferroelectric film formed by using the raw material solution according to the above-described embodiment. The piezoelectric device 1 includes a substrate 2, a lower electrode 3 formed on the substrate 2, a piezoelectric film 4 formed on the lower electrode 3, and an upper electrode 5 formed on the piezoelectric film 4.

As the substrate 2, a silicon substrate may be used. In one embodiment of the invention, a (110)-oriented single-crystal silicon substrate is used as the substrate 2. A (100)-oriented single-crystal silicon substrate or a (111)-oriented single-crystal silicon substrate may also be used as the substrate 2. In addition, a substrate obtained by forming an amorphous silicon oxide film such as a thermal oxide film or a natural oxide film on the surface of a silicon substrate may also be used as the substrate 2. The substrate 2 is processed so that ink cavities 521 are formed in an inkjet recording head 50 as described later (see FIG. 19).

The lower electrode 3 is an electrode for applying voltage to the piezoelectric film 4. The lower electrode 3 may be formed to have a planar shape the same as that of the piezoelectric film 4, for example. When a plurality of piezoelectric devices 1 are formed in the inkjet recording head 50 described later (see FIG. 19), the lower electrode 3 may be formed to function as a common electrode for the piezoelectric devices 1. The lower electrode 3 is formed to have a thickness of about 100 to 200 nm, for example.

The piezoelectric film 4 is a layer formed by using the raw material solution according to the above-described embodiment, and has a perovskite type structure.

The lower electrode 3 and the upper electrode 5 may be formed by using a sputtering method, a vacuum deposition method, or the like. The lower electrode 3 and the upper electrode 5 are formed of platinum (Pt), for example. The materials for the lower electrode 3 and the upper electrode 5 are not limited to Pt. For example, iridium (Ir), iridium oxide ($IrO_x$), titanium (Ti), $SrRuO_3$, or the like may be used.

According to the piezoelectric device according to one embodiment of the invention, since the piezoelectric film is formed by using the raw material solution according to the above-described embodiment, the piezoelectric film can be crystallized at a low temperature. Therefore, the piezoelectric device can be embedded with another semiconductor device.

7. Inkjet Recording Head and Inkjet Printer

Figure 19:
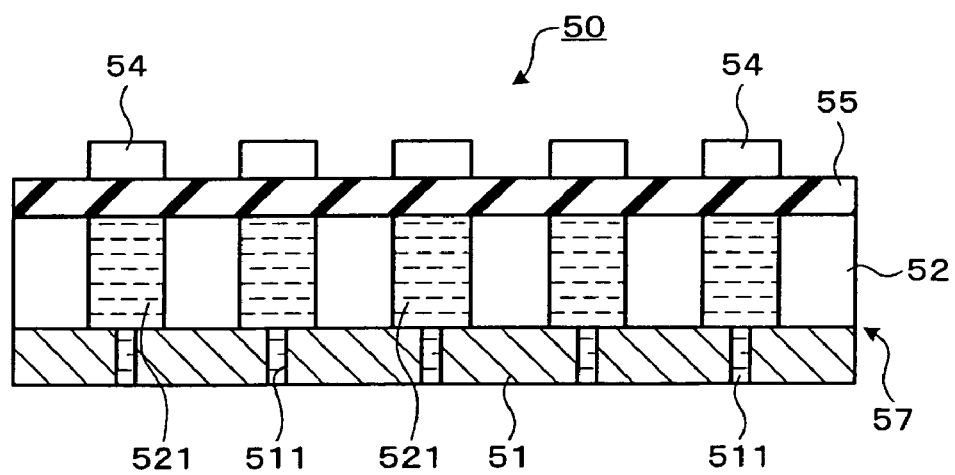
FIG. 19 is a schematic diagram of an inkjet recording head according to one embodiment of the invention.
Figure 20:
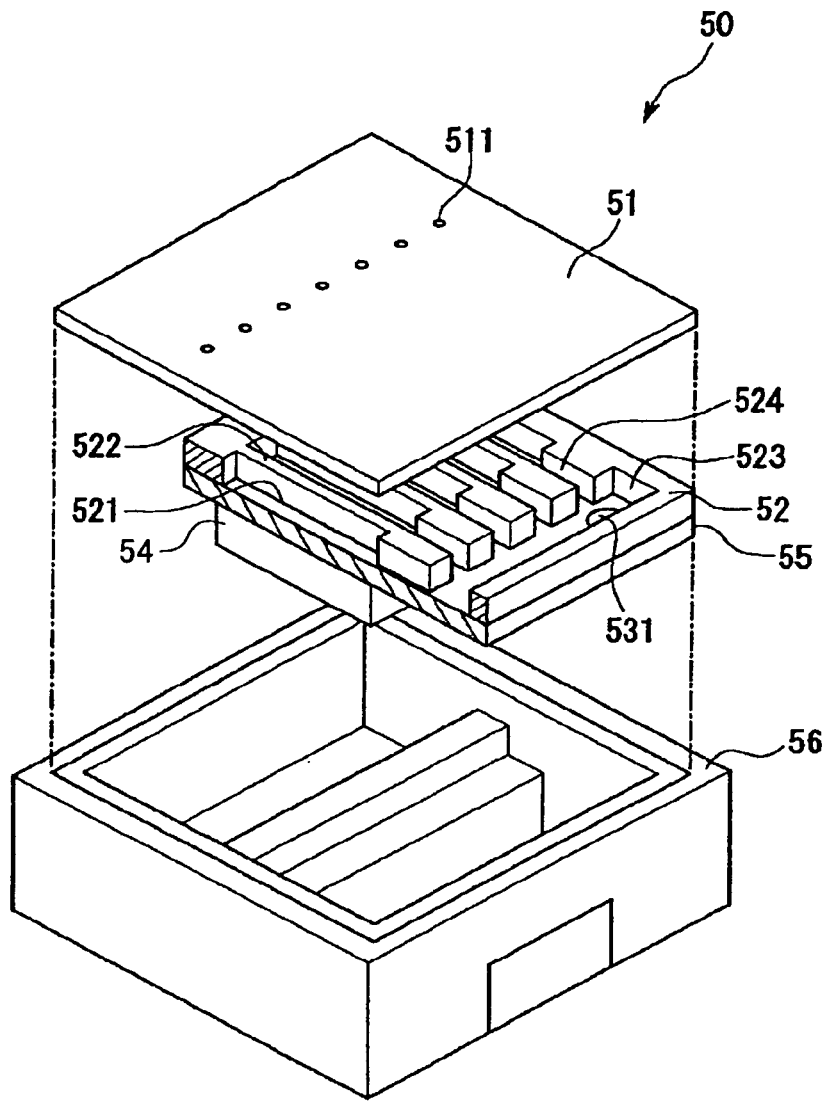
FIG. 20 is an exploded perspective view of an inkjet recording head according to one embodiment of the invention.
Figure 21:
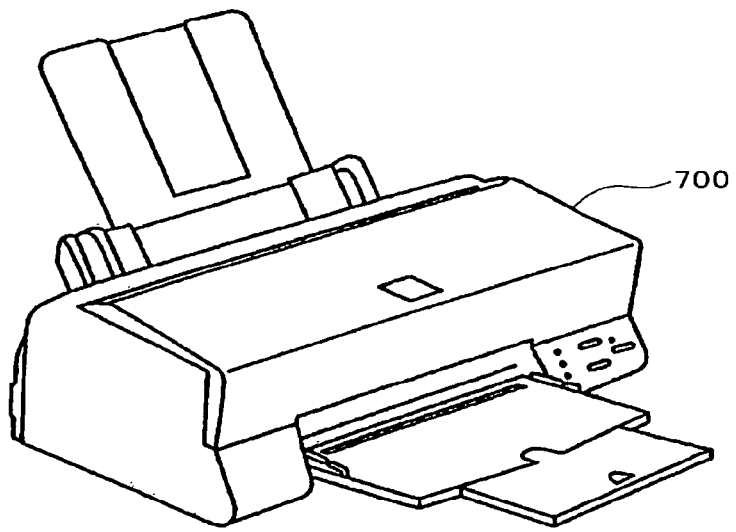
FIG. 21 is a schematic perspective view of an inkjet printer according to one embodiment of the invention.

An inkjet recording head in which the above-described piezoelectric device functions as a piezoelectric actuator, and an inkjet printer including the inkjet recording head are described below. The inkjet recording head and the inkjet printer are described below in that order. FIG. 19 is a side cross-sectional diagram showing a schematic configuration of the inkjet recording head according to one embodiment of the invention, and FIG. 20 is an exploded perspective view of the inkjet recording head which is reversed in the vertical direction. FIG. 21 shows an inkjet printer 700 including the inkjet recording head according to one embodiment of the invention.

7.1 Inkjet Recording Head

As shown in FIG. 19, the inkjet recording head 50 includes a head body (substrate) 57 and a piezoelectric section 54 formed over the head body 57. The piezoelectric device 1 shown in FIG. 18 is provided in the piezoelectric section 54. The piezoelectric device 1 is formed by stacking the lower electrode 3, the piezoelectric film (ferroelectric film) 4, and the upper electrode 5 in that order. The piezoelectric film 4 is a film formed by using the raw material solution described in "1. Precursor composition". In the inkjet recording head, the piezoelectric section 54 functions as a piezoelectric actuator.

The inkjet recording head 50 includes a nozzle plate 51, an ink chamber substrate 52, an elastic film 55, and the piezoelectric section 54 bonded to the elastic film 55. These components are accommodated in a housing 56. The inkjet recording head 50 forms an on-demand type piezo jet head.

The nozzle plate 51 formed of a stainless steel rolled plate or the like, in which a number of nozzles 511 for discharging ink droplets are formed in a row. The pitch between the nozzles 511 is appropriately set depending on the printing precision.

The ink chamber substrate 52 is attached (fixed) to the nozzle plate 51. In the ink chamber substrate 52, cavities (ink cavities) 521, a reservoir 523, and supply ports 524 are partitioned by the nozzle plate 51, a side wall (partition wall) 522, and the elastic film 55. The reservoir 523 temporarily stores ink supplied from an ink cartridge (not shown). The ink is supplied to each cavity 521 from the reservoir 523 through the supply ports 524.

As shown in FIGS. 19 and 20, the cavity 521 is disposed corresponding to the nozzle 511. The volume of the cavity 521 can be changed by vibration of the elastic film 55. The cavity 521 is configured to discharge the ink as a result of a change in volume.

A (110)-oriented single-crystal silicon substrate is used as the material for forming the ink chamber substrate 52. Since the (110)-oriented single-crystal silicon substrate is suitable for anisotropic etching, the ink chamber substrate 52 can be easy and reliably formed. The single-crystal silicon substrate is used so that the surface on which the elastic film 55 is formed is the (110) plane.

The elastic film 55 is disposed on the side of the ink chamber substrate 52 opposite to the nozzle plate 51. The piezoelectric sections 54 are disposed on the side of the elastic film 55 opposite to the ink chamber substrate 52. As shown in FIG. 20, a communication hole 531 is formed through the elastic film 55 in the thickness direction at a specific position of the elastic film 55. The ink is supplied to the reservoir 523 from the ink cartridge through the communication hole 531.

The piezoelectric section is electrically connected with a piezoelectric device driver circuit (not shown), and is actuated (vibrate or deformed) based on a signal from the piezoelectric device driver circuit. Specifically, the piezoelectric section 54 functions as a vibration source (head actuator). The elastic film 55 vibrates due to vibration (deflection) of the piezoelectric section 54, and functions to momentarily increase the pressure inside the cavity 521.

An example of the inkjet recording head which discharges ink is described above. However, one embodiment of the invention aims at a liquid jet head using a piezoelectric device and a liquid jet device in general. As the liquid jet head, a recording head used for an image recording device such as a printer, a color material jet head used to manufacture a color filter for a liquid crystal display or the like, an electrode material jet head used to form an electrode of an organic EL display, a field emission display (FED), or the like, a bio-organic substance jet head used to manufacture a bio-chip, and the like can be given.

The piezoelectric device according to one embodiment of the invention is not limited to the above-described application example. The piezoelectric device according to one embodiment of the invention may be applied to various products such as a piezoelectric pump, a surface acoustic wave (SAW) device, a thin-film piezoelectric resonator, a frequency filter, and an oscillator (e.g. voltage-controlled SAW oscillator).

Although some embodiments of the invention have been described, the invention is not limited to the above-described embodiments, and various modifications can be made within the scope of the invention.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. An inkjet coating ink including a precursor composition, the precursor composition including a precursor for forming a ferroelectric, the ferroelectric being shown by a general formula $AB_{1-x}C_xO_3$, an element A including at least Pb, an element B including at least one of Zr, Ti, V, W, and Hf, an element C including at least one of Nb and Ta, x being in a range of $0.1 \leqq x \leqq 0.3$, the precursor including the element A, the element B and the element C and part of the precursor including an ester bond, the precursor being dissolved in an organic solvent, the organic solvent including at least a first alcohol and a second alcohol having a boiling point and viscosity higher than a boiling point and viscosity of the first alcohol, and the viscosity of the inkjet coating ink being 10 cp or less.

2. The inkjet coating ink as defined in claim 1 wherein the element B includes Zr and Ti, and the element C includes Nb.

3. The inkjet coating ink as defined in claim 1, wherein the viscosity of the inkjet coating ink is 5 cp or less.

4. The inkjet coating ink as defined in claim 1, wherein the second alcohol is a monohydric alcohol.

5. The inkjet coating ink as defined in claim 1, wherein the ferroelectric includes 0.5 mol % or more of Si or Si and Ge.

6. The inkjet coating ink as defined in claim 1, wherein the ferroelectric includes 0.5 to 5 mol % of Si or Si and Ge.

* * * * *